US008515678B2

(12) United States Patent
Pepper et al.

(10) Patent No.: US 8,515,678 B2
(45) Date of Patent: Aug. 20, 2013

(54) CHRONO-STRATIGRAPHIC AND TECTONO-STRATIGRAPHIC INTERPRETATION ON SEISMIC VOLUMES

(75) Inventors: Randolph E. F. Pepper, Beijing (CN); Agnes Dubois, La Ferte Saint Cyr (FR); Manoj Vallikkat Thachaparambil, Kerala (IN); Philippe Paul Jacques Marza, Beijing (CN); Renchu Wu, Beijing (CN)

(73) Assignee: Schlumberger Technology Corporation, Sugar Land, TX (US)

( * ) Notice: Subject to any disclaimer, the term of this patent is extended or adjusted under 35 U.S.C. 154(b) by 152 days.

(21) Appl. No.: 12/846,035

(22) Filed: Jul. 29, 2010

(65) Prior Publication Data

US 2012/0029828 A1 Feb. 2, 2012

(51) Int. Cl.
G01V 1/00 (2006.01)
(52) U.S. Cl.
USPC .................................. 702/16; 702/14; 367/68
(58) Field of Classification Search
USPC ........................................ 702/14, 16; 367/68
See application file for complete search history.

(56) References Cited

U.S. PATENT DOCUMENTS

| 7,769,545 B2 * | 8/2010 | Lomask et al. ............ 702/14 |
| 2004/0260476 A1 | 12/2004 | Borgos et al. | |
| 2008/0140319 A1 | 6/2008 | Monsen et al. | |
| 2009/0119018 A1 | 5/2009 | Priezzhev et al. | |
| 2009/0204332 A1 | 8/2009 | Lomask et al. | |
| 2010/0223039 A1 | 9/2010 | Maliassov | |
| 2012/0029827 A1 | 2/2012 | Pepper et al. | |

OTHER PUBLICATIONS

Stark, Tracy J., "Relative geologic time (age) volumes—Relating every seismic sample to a geologically reasonable horizon," The Leading Edge, Sep. 2004, pp. 928-932.
IWGSS, "Toward the Formalization of Sequence Stratigraphy," website: sepmstrata.org/PDF-Files/SeqStrat.../Formal_Sequ_Strati_Feb_2007.pdf Feb. 2007, pp. 1-31.
Monsen et al., "Geological Process Controlled Interpretation", Reservoir Symposium 2006, pp. 1-6.

* cited by examiner

*Primary Examiner* — Sujoy Kundu
(74) *Attorney, Agent, or Firm* — Colin Wier; Rodney Warfford

(57) ABSTRACT

A method for performing chrono-stratigraphic interpretation of a subterranean formation. The method includes obtaining a seismic volume containing stratigraphic features of the subterranean formation deformed by structural events, performing structural restoration of the seismic volume to generate a restored seismic volume by removing deformation due to the structural events, performing a chrono-stratigraphic interpretation based on the restored seismic volume to generate chrono-stratigraphic objects each associated with a respective relative geologic age, and displaying the chrono-stratigraphic objects in a chrono-stratigraphic space according to the respective relative geologic age of each of the stratigraphic objects.

7 Claims, 12 Drawing Sheets

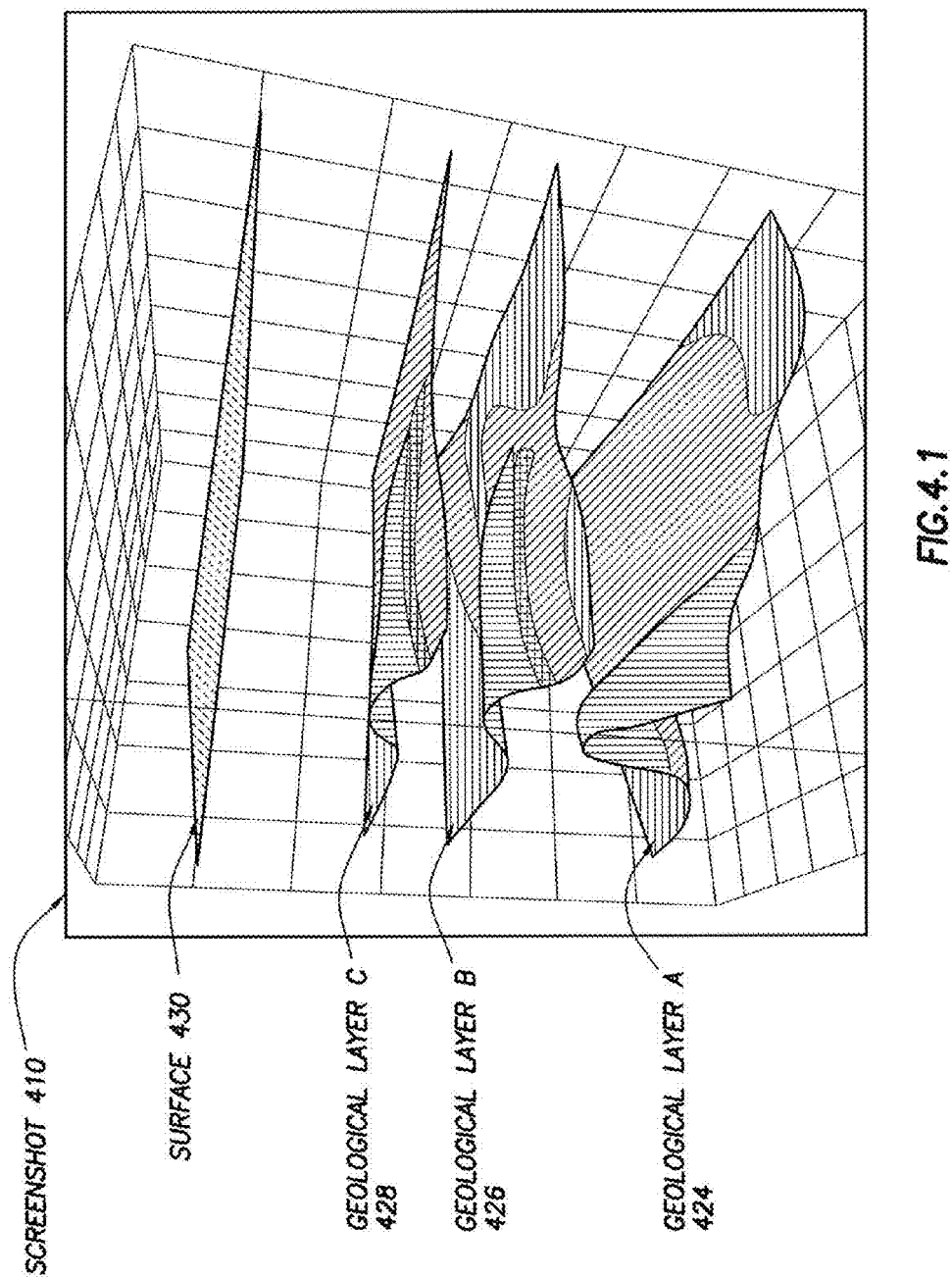
FIG.4.1

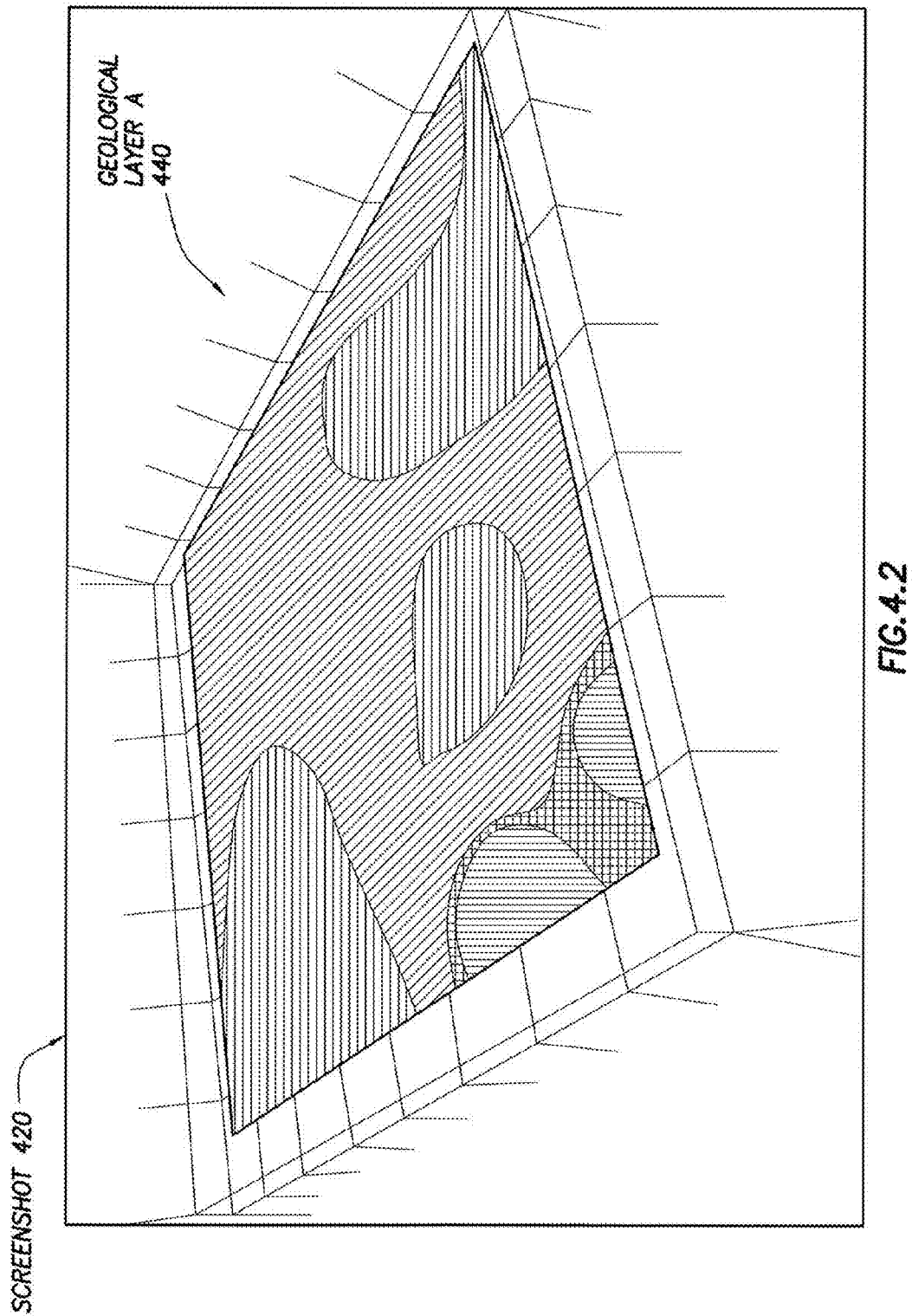
FIG. 4.2

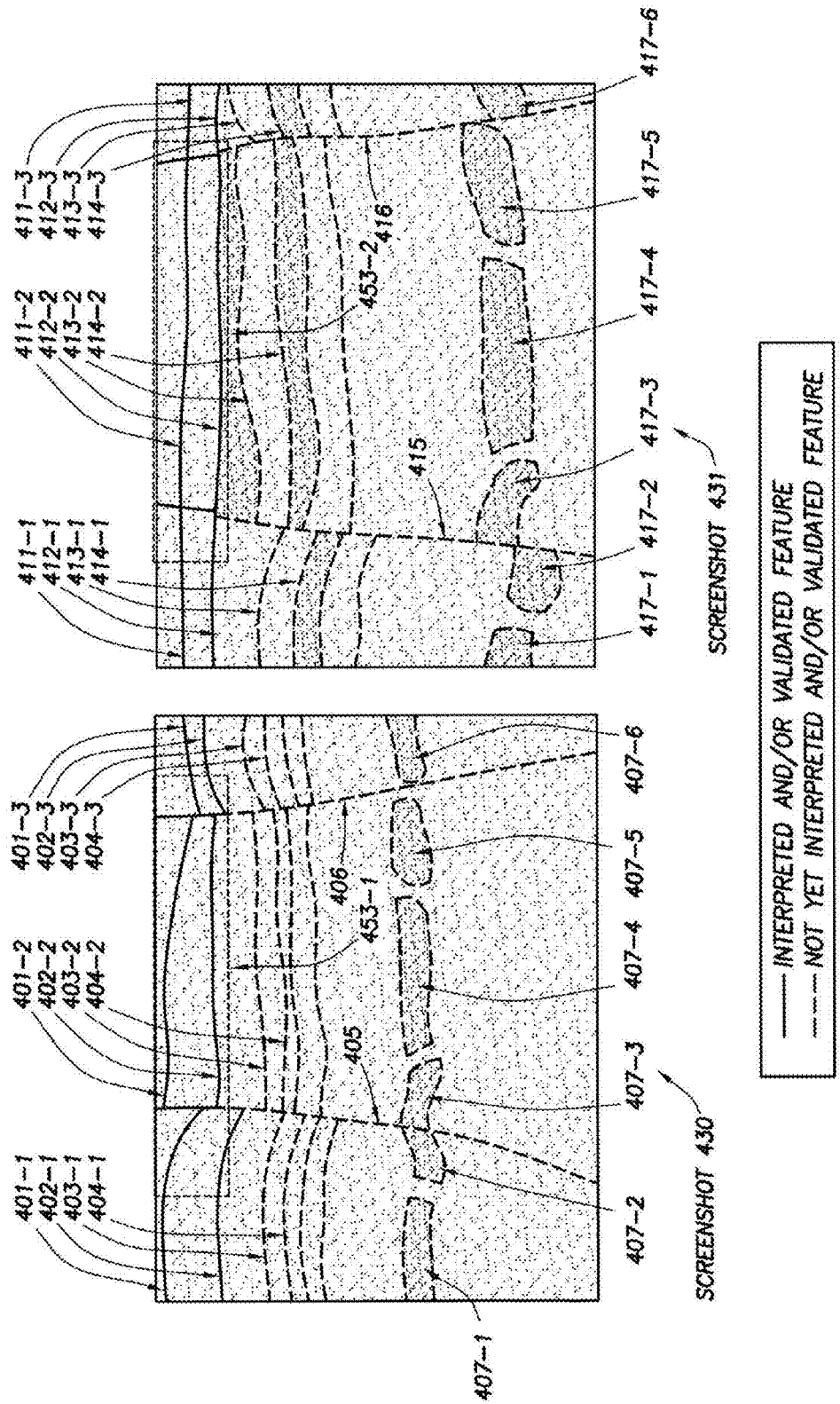
FIG. 4.3

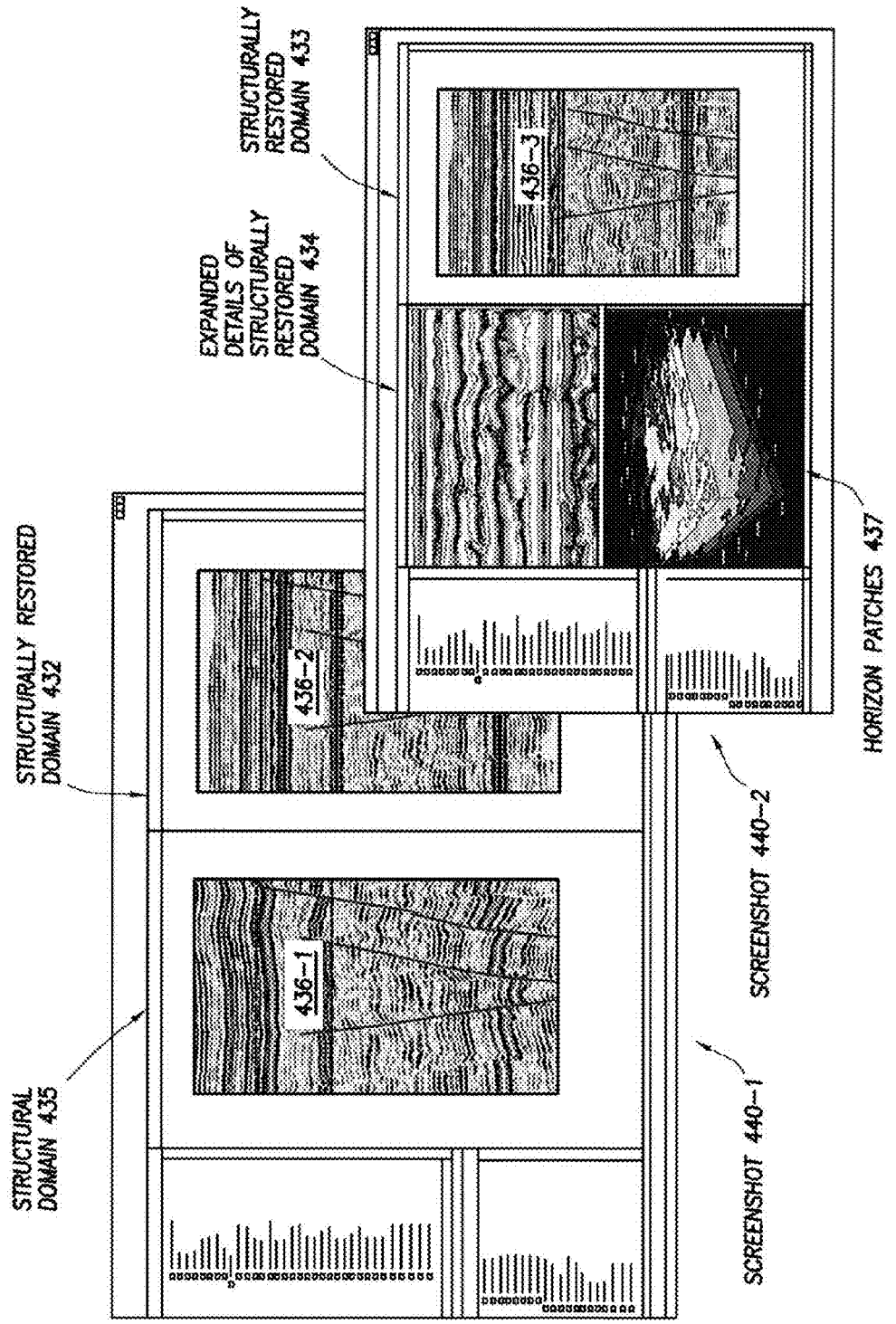
FIG. 4.4

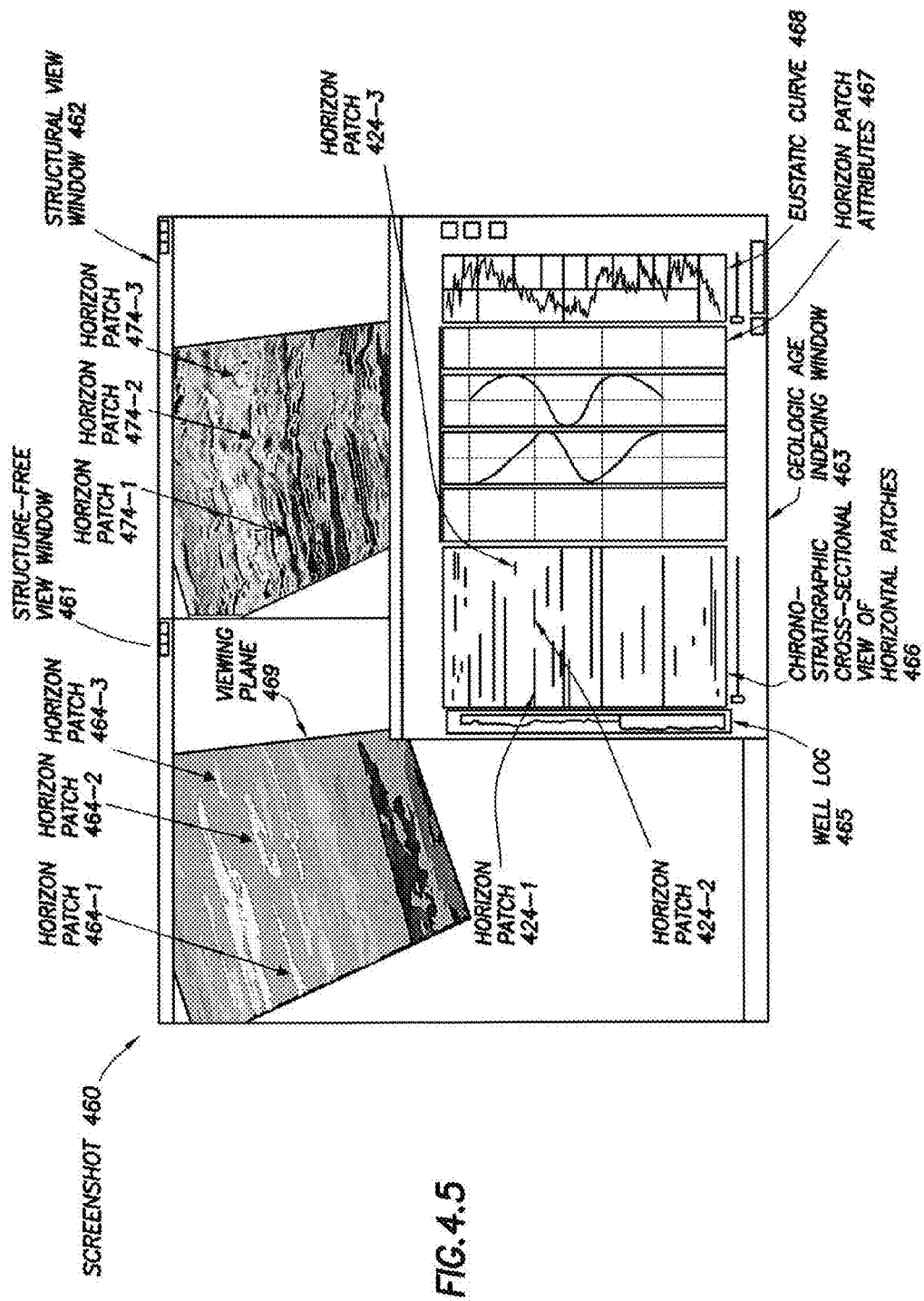
FIG. 4.5

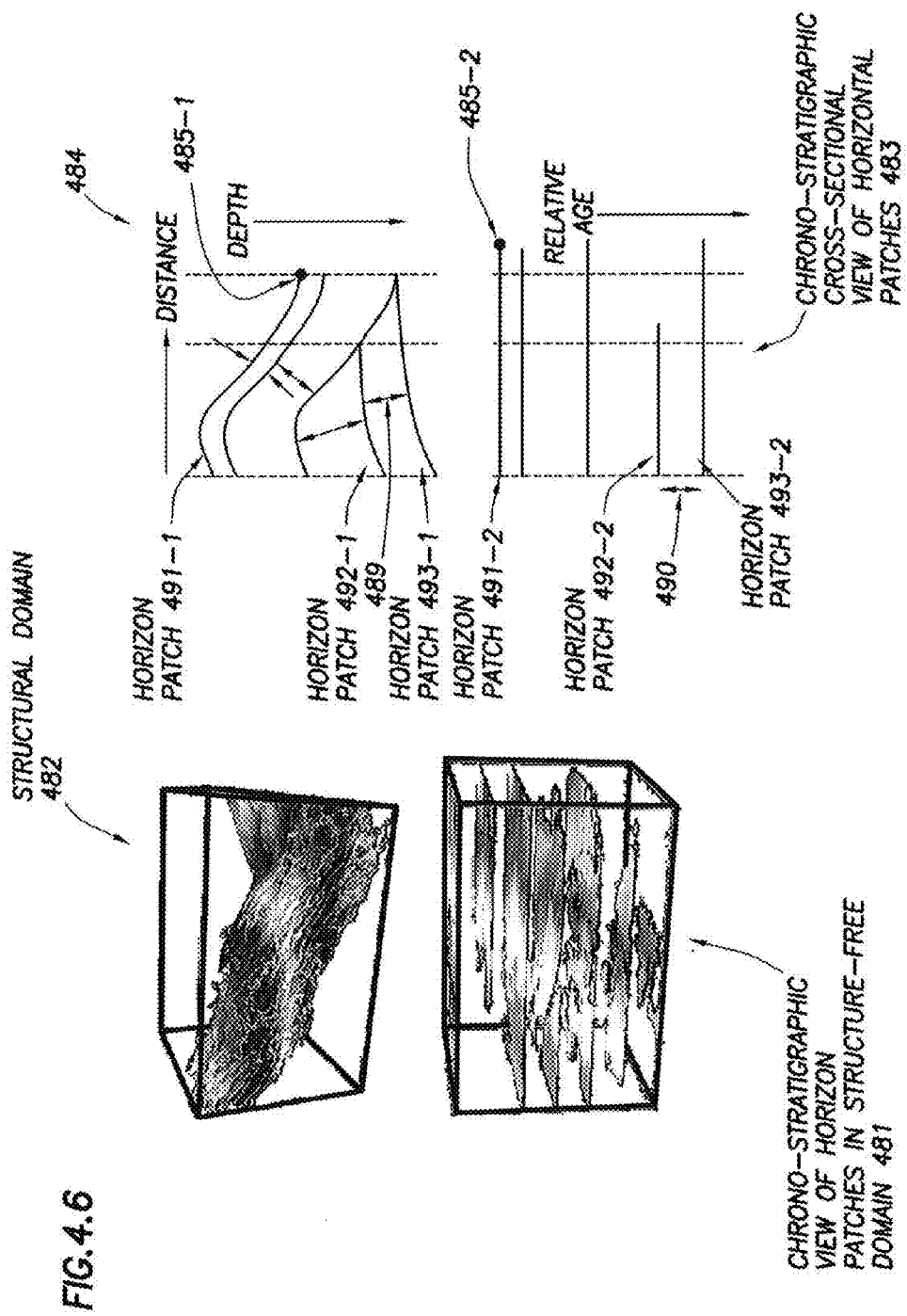
FIG.4.6

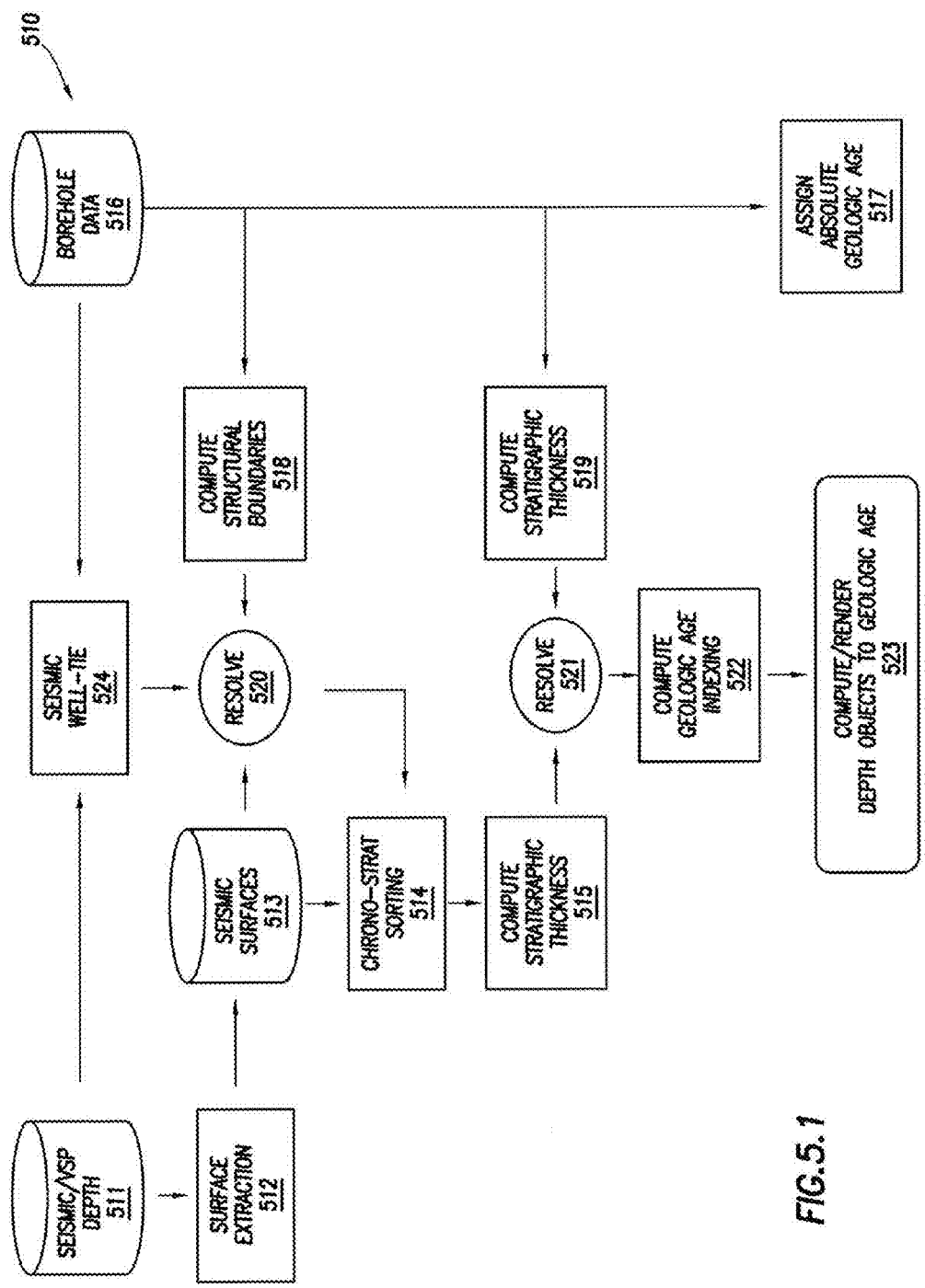
FIG.5.1

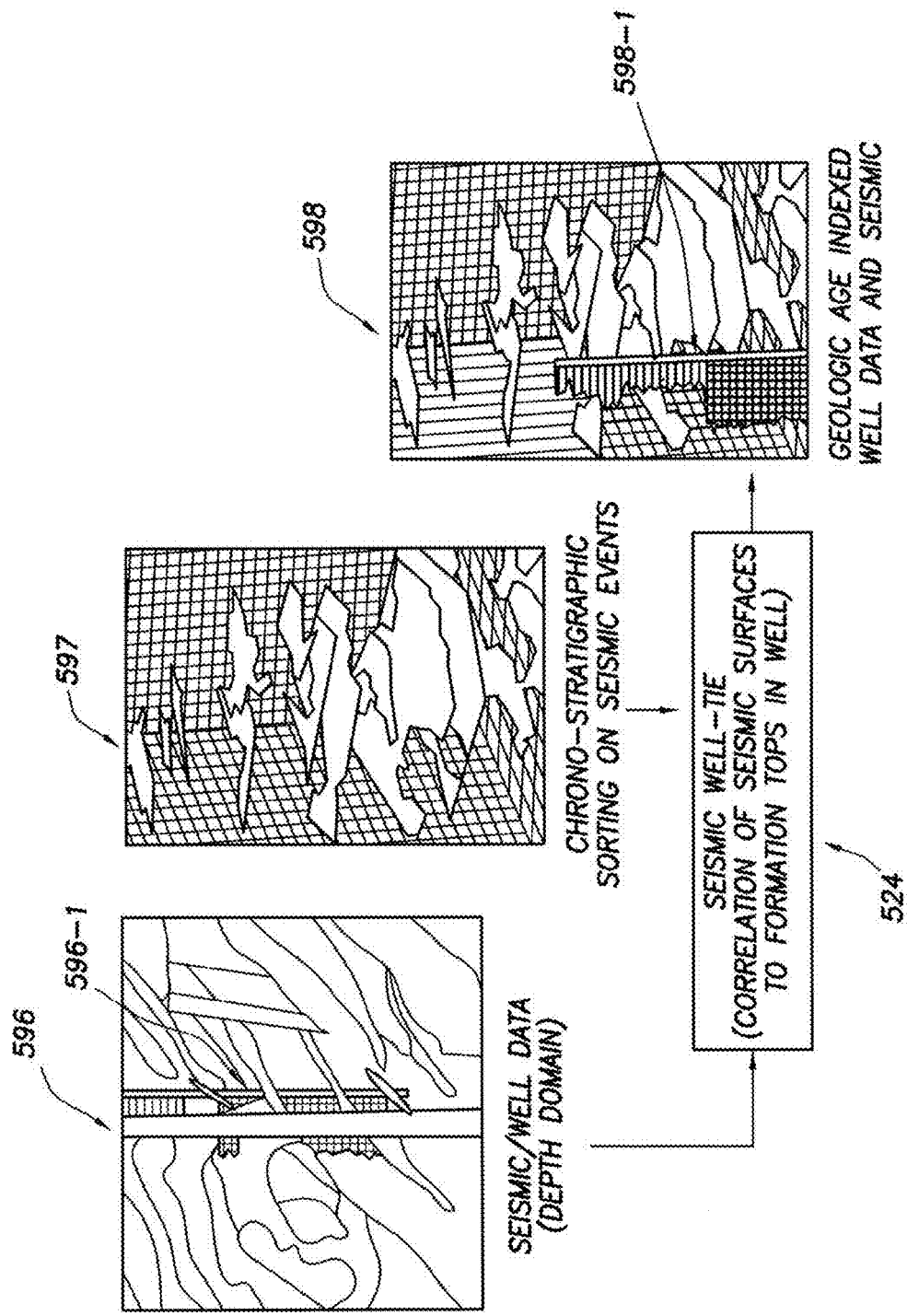
FIG.5.2

CHRONO-STRATIGRAPHIC AND TECTONO-STRATIGRAPHIC INTERPRETATION ON SEISMIC VOLUMES

CROSS REFERENCE TO RELATED APPLICATIONS

This application is related to copending U.S. patent application Ser. No. 12/845,958, filed on Jul. 29, 2010, and entitled "INTERACTIVE STRUCTURAL RESTORATION WHILE INTERPRETING SEISMIC VOLUMES FOR STRUCTURE AND STRATIGRAPHY", which is also assigned to the assignee of the present application, the subject matter of which is incorporated by reference herein.

BACKGROUND

Operations, such as surveying, drilling, wireline testing, completions, production, planning and field analysis, are typically performed to locate and gather valuable downhole fluids. Surveys are often performed using acquisition methodologies, such as seismic scanners or surveyors to generate maps of underground formations. These formations are often analyzed to determine the presence of subterranean assets, such as valuable fluids or minerals, or to determine if the formations have characteristics suitable for storing fluids. The subterranean assets are not limited to hydrocarbon such as oil, throughout this document, the terms "oilfield" and "oilfield operation" may be used interchangeably with the terms "field" and "field operation" to refer to a field having any types of valuable fluids or minerals and field operations relating to any of such subterranean assets.

During the field operations, data is typically collected for analysis and/or monitoring of the operations. Such data may include, for instance, information regarding subterranean formations, equipment, and historical and/or other data. Data concerning the subterranean formation is collected using a variety of sources. Such formation data may be static or dynamic. Static data relates to, for instance, formation structure and geological stratigraphy that define geological structures of the subterranean formation. Dynamic data relates to, for instance, fluids flowing through the geologic structures of the subterranean formation over time. Such static and/or dynamic data may be collected to learn more about the formations and the valuable assets contained therein.

The data may be used to predict downhole conditions and make decisions concerning field operations. Such decisions may involve well planning, well targeting, well completions, operating levels, production rates and other operations and/or operating parameters. There are usually a large number of variables and large quantities of data to consider in analyzing field operations. It is, therefore, often useful to model the behavior of the field operation to determine the desired course of action. During the ongoing operations, the operating parameters may be adjusted as field conditions change and new information is received. Techniques have been developed to model the behavior of various aspects of field operations, such as geological structures, downhole reservoirs, wellbores, surface facilities, as well as other portions of the field operation.

Stratigraphy is fundamental to the discipline of geology in describing the spatial, geometrical, structural, sequential and temporal relationships of rock units. In response to the formation of rocks in highly variable depositional environments and with varying sedimentary compositions, stratigraphic approaches span a wide range of disciplines, such as, litho-, bio-, chrono-, magneto-, seismic-, sequence- and chemo-stratigraphy. Generally, in early stage geological exploration, little or no information is available on sediment characteristics. The identification and analysis of a potential hydrocarbon reservoir is a matter of interpretation and analysis of seismic reflection data.

Seismic surveying is generally performed by imparting energy to the earth at one or more source locations, for example, by way of controlled explosion, mechanical input etc. Return energy is then measured at surface receiver locations at varying distances and azimuths from the source location. The travel time of energy from source to receiver, via reflections and refractions from interfaces of subsurface strata, indicates the depth and orientation of such strata. Seismic data, as collected via the receiver, within a volume of interest is referred to as seismic volume. A seismic volume can be displayed as seismic images based on different sampling resolutions and viewing orientations as well as subject to various different seismic amplitude processing techniques to enhance or highlight seismic reflection patterns.

Seismic images indirectly show the distribution of material deposited over large areas. The spatial (and temporal) variability of stacking patterns, or sequences, observed in seismic images relates to depositional environments and post-depositional processes, such as erosion and tectonic activity. During seismic interpretation, reflection patterns in the seismic images linking depositional environments and vertical stacking order to sequence of deposition and, thus, relative timing, enables the geological history of the subsurface to be deciphered and leads to the estimation of probable sedimentary characteristics. In this manner, a potential hydrocarbon reservoir may be identified and analyzed based on interpretation and analysis of seismic reflection data. However, performing seismic data interpretation over large seismic volumes can be a daunting task, particularly if done manually.

SUMMARY

In general, in one aspect, the invention relates to a method for performing chrono-stratigraphic interpretation of a subterranean formation. The method includes obtaining a seismic volume comprising a plurality of stratigraphic features of the subterranean formation, wherein the plurality of stratigraphic features are deformed by a plurality of structural events, performing, using a processor of a computer system, a structural restoration of the seismic volume to generate a restored seismic volume by removing deformation due to the plurality of structural events, wherein the restored seismic volume comprises a plurality of restored stratigraphic features, performing, using the processor, a chrono-stratigraphic interpretation based on the restored seismic volume to generate a plurality of chrono-stratigraphic objects each associated with a respective relative geologic age, and displaying the plurality of chrono-stratigraphic objects in a chrono-stratigraphic space according to the respective relative geologic age of each of the plurality of stratigraphic objects.

Other aspects of chrono-stratigraphic and tectono-statigraphic interpretation on seismic volumes will be apparent from the following description and the appended claims.

BRIEF DESCRIPTION OF DRAWINGS

The appended drawings illustrate several embodiments of chrono-stratigraphic and tectono-statigraphic interpretation on seismic volumes and are not to be considered limiting of its scope, for chrono-stratigraphic and tectono-statigraphic interpretation on seismic volumes may admit to other equally effective embodiments.

FIGS. 4.1-4.6 each show an example display screenshot for chrono-stratigraphic and tectono-statigraphic interpretation on seismic volumes in accordance with one or more embodiments.

FIGS. 5.1 and 5.2 show an example workflow for chrono-stratigraphic and tectono-statigraphic interpretation on seismic volumes in accordance with one or more embodiments.

DETAILED DESCRIPTION

Figure 1:
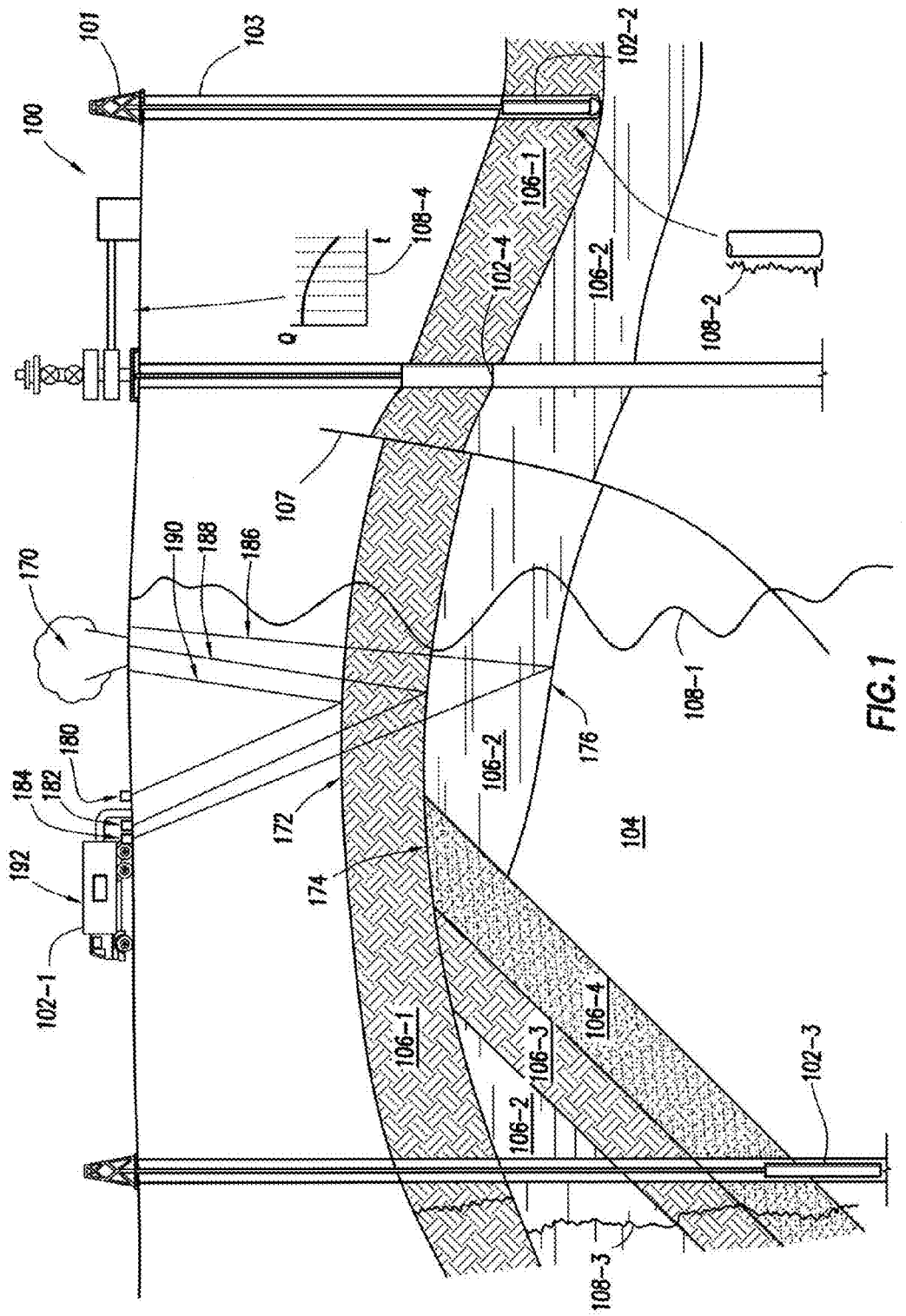
FIG. 1 is a schematic view, partially in cross-section, of a field having a plurality of data acquisition tools positioned at various locations along the field for collecting data from the subterranean formation, in which embodiments of chrono-stratigraphic and tectono-statigraphic interpretation on seismic volumes may be implemented.

Embodiments are shown in the above-identified drawings and described below. In describing the embodiments, like or identical reference numerals are used to identify common or similar elements. The drawings are not necessarily to scale and certain features and certain views of the drawings may be shown exaggerated in scale or in schematic in the interest of clarity and conciseness.

U.S. Patent Publication No. 2004/0260476 discloses a method for automated extraction of surface primitives from seismic data. U.S. Patent Publication No. 2008/0140319 A1 discloses a method for processing stratigraphic data including stratigraphic features such as horizon surfaces and assigning the stratigraphic features respective relative geologic ages. Whether performed manually or assisted by automated methods, correct stratigraphic interpretation can be difficult to resolve in the presence of complex geological structures caused by tectonic events.

In one or more embodiments of chrono-stratigraphic and tectono-statigraphic interpretation on seismic volumes, structural restoration methods are applied to the seismic volumes to remove the structural effect (e.g., related to tectonic events) allowing improved interpretation of chrono-stratigraphic features. In one or more embodiments, interpretation of such features on seismic volumes is performed by enabling dual-domain interpretation of seismic features in the present day depth domain and simultaneously in a structurally restored seismic domain. Specifically, interpretation of the chrono-stratigraphic and depositional geometry is performed on structurally restored seismic volumes while concurrently viewing the interpretation results in the structural domain. The concurrent analysis increases the interpretation confidence gained by improved correlation of structural deformed events (i.e., features in seismic image) to their pre-structurally deformed geometry.

In one or more embodiments, relative geologic age is constructed from the chrono-stratigraphic sorted seismic events by computing the true stratigraphic thickness between the events. For example, the thickness (in depth) may be the shortest distance between the two seismic event surfaces along a vector defined by the average dips of the two events. The depth thickness may then be mapped to a user-defined deposition rate to determine a relative geologic age. In one or more embodiments, chrono-stratigraphic interpreted features are displayed in the structurally restored seismic domain based on the true stratigraphic thickness between the events.

In one or more embodiments, borehole geology is integrated in the aforementioned interpretation process to provide validation of the structural restoration consistent with the structural dip removal on the borehole dips. Specifically, borehole stratigraphic interpretation is correlated to the structure-free seismic volume by associating key geologic markers in the well log to their corresponding surface extracted from the seismic volume. Once calibrated in this fashion, the well log data can be transformed from depth indexed to relative geologic age index presentation. In one or more embodiments, chrono-stratigraphic interpreted features and well log are displayed in the structurally restored seismic domain correlated based on the geologic age index.

In one or more embodiments, structural deformation may be progressively removed from the seismic volume, corresponding to moving back in geologic time. The interpretation can be performed in either domain (present-day structure or structurally restored to a defined geologic event), and the interpretation may be mapped to any other computed geologic age or present structural age.

In one or more embodiments, horizon surfaces are sampled within a restored geological layer in the seismic volume such that the horizon surfaces could be assigned respective relative geologic ages in a methodical and self-consistent manner to avoid conflicts between the relative geologic ages of different horizon surfaces. Typically the horizon surfaces are seismic horizon surfaces where each surface corresponds to an event in the seismic data. Typically, although not necessarily, the horizon surfaces are parallel to each other and spatially continuous. Further, the horizon surfaces correspond to interfaces between strata, although the horizon surfaces may also be used to represent boundaries of geobodies, such as hydrocarbon reservoirs or salt bodies. More generally, the method described below may be used to assign relative geologic ages to stratigraphic features such as horizon surfaces, geobodies, or faults. Nonetheless, in what follows the method is described in relation to horizon surfaces.

FIG. 1 depicts a schematic view, partially in cross section of a field (100) having data acquisition tools (e.g., seismic truck (102-1), drilling tool (102-2), wireline tool (102-3), and production tool (102-4)) positioned at various locations in the field for gathering data of a subterranean formation (104). As shown, the data collected from the tools (102-1) through 102-4) can be used to generate data plots (108-1) through 108-4), respectively.

As shown in FIG. 1, the subterranean formation (104) includes several geological structures (106-1) through 106-4). As shown, the formation has a sandstone layer (106-1), a limestone layer (106-2), a shale layer (106-3), and a sand layer (106-4). A fault line (107) extends through the formation. In one or more embodiments, the static data acquisition tools are adapted to measure the formation and detect the characteristics of the geological structures of the formation.

As shown in FIG. 1, seismic truck (102-1) represents a survey tool that is adapted to measure properties of the subterranean formation. The survey operation is a seismic survey operation for producing sound vibrations. One such sound vibration (e.g., 186, 188, 190) generated by a source (170) reflects off a plurality of horizons (e.g., 172, 174, 176) in the subterranean formation (104). Each of the sound vibrations (e.g., 186, 188, 190) are received by one or more sensors (e.g., 180, 182, 184), such as geophone-receivers, situated on the earth's surface. The geophones produce electrical output signals, which may be transmitted, for example, as input data to a computer (192) on the seismic truck (102-1). Responsive to the input data, the computer (192) may generate a seismic data output.

As shown in FIG. 1, a drilling operation is depicted as being performed by drilling tools (102-2) suspended by a rig (101) and advanced into the subterranean formations (104) to form a wellbore (103). The drilling tools (106b) may be adapted for measuring downhole properties using logging-while-drilling ("LWD") tools.

A surface unit (not shown) is used to communicate with the drilling tools (102-2) and/or offsite operations. The surface unit is capable of communicating with the drilling tools (102-2) to send commands to the drilling tools (102-2), and to receive data therefrom. The surface unit may be provided with computer facilities for receiving, storing, processing, and/or analyzing data from the oilfield. The surface unit collects data generated during the drilling operation and produces data output which may be stored or transmitted. Computer facilities, such as those of the surface unit, may be positioned at various locations about the oilfield and/or at remote locations.

Sensors, such as gauges, may be positioned about the oilfield to collect data relating to various oilfield operations as described previously. For example, the sensor may be positioned in one or more locations in the drilling tools (102-2) and/or at the rig (101) to measure drilling parameters, such as weight on bit, torque on bit, pressures, temperatures, flow rates, compositions, rotary speed, and/or other parameters of the oilfield operation.

The data gathered by the sensors may be collected by the surface unit and/or other data collection sources for analysis or other processing. The data collected by the sensors may be used alone or in combination with other data. The data may be collected in one or more databases and/or transmitted on or offsite. All or select portions of the data may be selectively used for analyzing and/or predicting oilfield operations of the current and/or other wellbores. The data may be historical data, real time data, or combinations thereof. The real time data may be used in real time, or stored for later use. The data may also be combined with historical data or other inputs for further analysis. The data may be stored in separate databases, or combined into a single database.

The collected data may be used to perform activities, such as wellbore steering. In another example, the seismic data output may be used to perform geological, geophysical, and/or reservoir engineering. In this example, the reservoir, wellbore, surface and/or process data may be used to perform reservoir, wellbore, geological, geophysical, or other simulations. The data outputs from the oilfield operation may be generated directly from the sensors, or after some preprocessing or modeling. These data outputs may act as inputs for further analysis.

As shown in FIG. 1, data plots (108-1 through 108-4) are examples of plots of static and/or dynamic properties that may be generated by the data acquisition tools (102-1 through 102-4), respectively. For example, data plot (108-1) is a seismic two-way response time. In another example, data plot (108-2) is core sample data measured from a core sample of the formation (104). In another example, data plot (108-3) is a logging trace. In another example, data plot (108-4) is a plot of a dynamic property, the fluid flow rate over time. Those skilled in the art will appreciate that other data may also be collected, such as, but not limited to, historical data, user inputs, economic information, other measurement data, and other parameters of interest.

While a specific subterranean formation (104) with specific geological structures is depicted, it will be appreciated that the formation may contain a variety of geological structures. Fluid, rock, water, oil, gas, and other geomaterials may also be present in various portions of the formation. Each of the measurement devices may be used to measure properties of the formation and/or its underlying structures. While each acquisition tool is shown as being in specific locations along the formation, it will be appreciated that one or more types of measurement may be taken at one or more location across one or more fields or other locations for comparison and/or analysis using one or more acquisition tools. The terms measurement device, measurement tool, acquisition tool, and/or field tools are used interchangeably in this documents based on the context.

The data collected from various sources, such as the data acquisition tools of FIG. 1, may then be evaluated. Typically, seismic data displayed in the data plot (108-1) from the data acquisition tool (102-1) is used by a geophysicist to determine characteristics of the subterranean formation (104). Core data shown in plot (108-2) and/or log data from the well log (108-3) is typically used by a geologist to determine various characteristics of the geological structures of the subterranean formation (104). Production data from the production graph (108-4) is typically used by the reservoir engineer to determine fluid flow reservoir characteristics.

Figure 2:
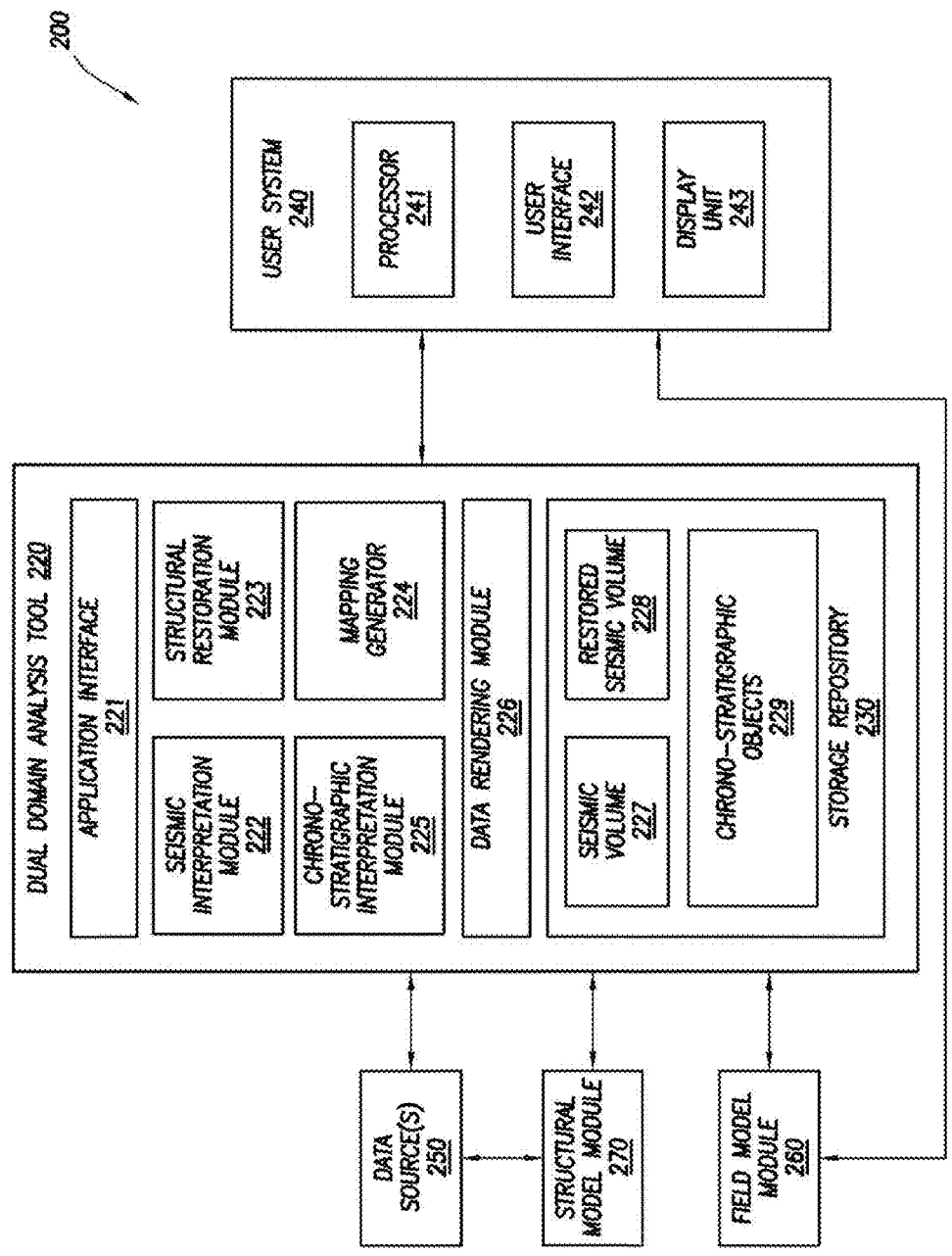
FIG. 2 shows a system in which one or more embodiments of chrono-stratigraphic and tectono-statigraphic interpretation on seismic volumes may be implemented.

FIG. 2 shows a diagram of a system (200) to perform chrono-stratigraphic and tectono-statigraphic interpretation on seismic volumes in accordance with one or more embodiments. The system (200) includes a dual domain analysis tool (220), a user system (240), one or more data sources (250), a field model module (260), and a structural model module (270). The dual domain analysis tool (220) includes a storage repository (230), one or more application interfaces (221), a seismic interpretation module (222), a structural restoration module (223), a mapping generator (224), a chrono-stratigraphic interpretation module (225), and a data rendering module (226). The user system (240) includes a processor (241), a user interface (242), and a display unit (243). Each of these components is described below. One of ordinary skill in the art will appreciate that embodiments are not limited to the configuration shown in FIG. 2.

In one or more embodiments, the dual domain analysis tool (220) is configured to interact with one or more data sources (250) using one or more of the application interface(s) (221). The application interface (221) may be configured to receive data (e.g., field data) from a data source (250) and/or store data in the storage repository (230). In addition, the application interface (221) may be configured to receive data from the storage repository (230) and deliver the data to a data source (250). A data source (250) may be one of a variety of sources providing data associated with a field. A data source (250) may include, but is not limited to, a surface unit for collecting data from the field, a computer, a database, a spreadsheet, a user, and a data acquisition tool as described above with respect to FIG. 1. The data source (250) may be configured to provide data to the application interface (221) through an automated process, such as through a web-based application, a direct feed, or some other form of automated process. Optionally, the data source (250) may require manual entry of data by a user through a user system (240) using the application interface (221).

In one or more embodiments, the dual domain analysis tool (220) is configured to interact with the structural model module (270) using one or more of the application interfaces (221). The application interface (221) may be configured to receive data (e.g., model output) from the structural model module (270) and/or store the data in the storage repository (230). In addition, the application interface (221) may be configured to receive data from the storage repository (230) and deliver the data to the structural model module (270). The structural model module (270) may use data, received from the dual domain analysis tool (220) and/or one or more data sources (250), to generate a structural model of a field. The structural model of the field produced by the structural model module (270) may be in two or three dimensions. In one or more embodiments, the structural model is used to mathematically model (e.g., using a simulation system) geological bodies within a subterranean formation. For example, the structural model may describe the characteristics of a boundary layer between rock volumes with different properties or between solid earth and the atmosphere or the hydrosphere. The structural model may also describe the lithology of deposits, or may relate to surface morphology, age (as opposed to deposit age), or depositional environment. The surfaces in the structural model may represent boundaries of volumes. The output of a structural model may be used to understand a subterranean formation. The structural model module (270) may be a device internal to the dual domain analysis tool (220). Alternatively, the structural model module (270) may be an external device operatively connected to the dual domain analysis tool (220). The structural model module (270) may be configured to provide data to the application interface (221) through an automated process, such as through a web-based application, a direct feed, or some other form of automated process. Optionally, the structural model module (270) may require manual entry of data by a user through the user system (240) using the application interface (221).

In one or more embodiments, the dual domain analysis tool (220) is configured to interact with the field model module (260) using one or more of the application interfaces (221)). The application interface (221) may be configured to receive data (e.g., model output) from the field model module (260) and/or store the data in the storage repository (230). In addition, the application interface (221) may be configured to receive data from the storage repository (230) and deliver the data to the field model module (260). The field model module (260) may use data, received from the dual domain analysis tool (220), to generate an operating plan for a field based on the output of the dual domain analysis tool (220), as described below. The field model module (260) may be a device internal to the dual domain analysis tool (220). Alternatively, the field model module (260) may be an external device operatively connected to the dual domain analysis tool (220). The field model module (260) may be configured to provide data to the application interface (221) through an automated process, such as through a web-based application, a direct feed, or some other form of automated process. Optionally, the field model module (260) may require manual entry of data by a user through the user system (240) using the application interface (221). The field model module (260) may also be configured to send data (e.g., model output) directly to the user system (240).

In one or more embodiments, the processor (i.e., central processing unit (CPU)) (241) of the user system (240) is configured to execute instructions to operate the components of the user system (240) (e.g., the user interface (242), the display unit (243)).

In one or more embodiments, the user system (240) is configured to interact with a user using the user interface (242). The user interface (242) may be configured to receive data and/or instruction(s) from the user. The user interface (242) may also be configured to deliver instruction(s) to the user. In addition, the user interface (242) may be configured to send data and/or instruction(s) to, and receive data and/or instruction(s) from, the dual domain analysis tool (220) and/or the field model module (260). Examples of a user may include, but are not limited to, an individual, a group, an organization, or some other legal entity. The user system (240) may be, or may contain a form of, an internet-based communication device that is capable of communicating with the application interface (221) of the dual domain analysis tool (220). Alternatively, the dual domain analysis tool (220) may be part of the user system (240). The user system (240) may correspond to, but is not limited to, a desktop computer with internet access, a laptop computer with internet access, a smart phone, and a personal digital assistant (PDA), or other user accessible device.

In one or more embodiments, the user system (240) may include a display unit (243). The display unit (243) may be configured to display data for user visualization. For example, the data may include those stored in the storage repository (230).

As shown, communication links are provided between the dual domain analysis tool (220) and the user system (240), the data source(s) (250), the structural model module (270), and the field model module (260). A communication link is also provided between the data source(s) (250) and the structural model module (270), and between the user system (240) and the field model module (260). A variety of links may be provided to facilitate the flow of data through the system (200). For example, the communication links may provide for continuous, intermittent, one-way, two-way, and/or selective communication throughout the system (200). The communication links may be of any type, including but not limited to wired and wireless.

In one or more embodiments, a central processing unit (CPU, not shown) of the dual domain analysis tool (220) is configured to execute instructions to operate the components of the dual domain analysis tool (220) (e.g., storage repository (230), the application interface (221), the seismic interpretation module (222), the structural restoration module (223), the mapping generator (224), the chrono-stratigraphic interpretation module (225), and the data rendering module (226)). In one or more embodiments, the memory (not shown) of the dual domain analysis tool (220) is configured to store software instructions for interactive structural restoration while interpreting seismic data of a field. The memory may be one of a variety of memory devices, including but not limited to random access memory (RAM), read-only memory (ROM), cache memory, and flash memory. The memory may be further configured to serve as back-up storage for information stored in the storage repository (230).

In one or more embodiments, the dual domain analysis tool (220) is configured to obtain and store field data or data generated by various components of the dual domain analysis tool (220) in the storage repository (230). In one or more embodiments, the storage repository (230) is a persistent storage device (or set of devices) and is configured to receive field data from a data source(s) (250), the structural model module (270), the field model module (260), and/or from a user system (240) using the application interface (221). The storage repository (230) is also configured to deliver data to, and receive data from, the seismic interpretation module (222), the structural restoration module (223), the mapping generator (224), the chrono-stratigraphic interpretation module (225), and/or the data rendering module (226). The storage repository (230) may be a data store (e.g., a database, a file system, one or more data structures configured in a memory, an extensible markup language (XML) file, some other medium for storing data, or any suitable combination thereof), which may include information (e.g., historical data, user information, field location information) related to the collection of field data for a field. The storage repository (230) may be a device internal to the dual domain analysis tool (220). Alternatively, the storage repository (230) may be an external storage device operatively connected to the dual domain analysis tool (220).

In one or more embodiments, the dual domain analysis tool (220) is configured to interact with the user system (240) using the application interface (221). The application interface (221) may be configured to receive data and/or instruction(s) from the user system (240). The application interface (221) may also be configured to deliver instruction(s) to the user system (240). In addition, the application interface (221) may be configured to send data and/or instruction(s) to, and receive data and/or instruction(s) from, the storage repository (230), the seismic interpretation module (222), the structural restoration module (223), the mapping generator (224), the chrono-stratigraphic interpretation module (225), and/or the data rendering module (226).

In one or more embodiments, the data transferred between the application interface (221) and the data source (250), the structural model module (270), the field model module (260), and/or the user system (240) corresponds to field data, fractures, stresses and strains, and/or various models of the field. In one or more embodiments, the dual domain analysis tool (220) is configured to support various data formats provided by the data source(s) (250), the structural model module (270), the field model module (260), and/or the user system (240).

In one or more embodiments, the dual domain analysis tool (220) is configured to perform seismic data interpretation of a field using the seismic interpretation module (222). The seismic interpretation module (222) may be configured to receive seismic data from the application interface (221) and identify geological features corresponding to seismic reflection patterns. Specifically, the seismic interpretation module (222) may receive a seismic data volume of the field (as generated by one or more of the data source(s) (250)) from the application interface (221). This seismic data volume may be stored in the storage repository (230) as the seismic volume (227). The geological features identified by the seismic interpretation module (222) may include, but are not limited to, horizons, geological layers, sedimentary layers, faults, geobodies, reservoirs, etc. and stored as interpreted seismic features (not shown) in the storage repository (230). In one or more embodiments, the interpreted seismic features may be stored as annotations in the seismic volume (227). The identified geological layers may be differentiated by geologic age, formation type, or some other suitable differentiation of layers in the field. In one or more embodiments, layers of greater geologic age are located further away from the surface than layers of lesser geologic age. The seismic interpretation module (222) may be configured to send the identified geological features to the structural model module (270) via the application interface (221) to be used in generating a structural model.

In one or more embodiments, the dual domain analysis tool (220) is configured to perform a structural evolution analysis of a model of a field using the structural restoration module (223). The structural restoration module (223) may be configured to receive a model from the application interface (221) and restore each of the layers of the model in a batch process. Specifically, the structural restoration module (223) may receive a structural model of the field, as generated by the structural model module (270), from the application interface (221). The structural restoration module (223) may also be configured to receive the annotated seismic volume (227) (i.e., including the geological features identified by the seismic interpretation module (222)) as a model and restore each layer of the model interactively while the layer is being identified by the seismic interpretation module (222). Additional details of such restoring while interpreting techniques are described in the aforementioned copending U.S. patent application Ser. No. 12/845,958, which is incorporated herein by reference. Whether restored in a batch process or interactively, the layers restored by the structural restoration module (223) are referred to as restored geological layers and may be stored as part of the restored seismic volume (228) in the storage repository (230).

In one or more embodiments, the dual domain analysis tool (220) is configured to generate a 3D displacement mapping using a mapping generator (224). Specifically, the 3D displacement mapping removes effects (e.g., faulting and/or folding effects) of structural events on the seismic volume (227) and geometrically maps the geological layer into the restored geological layers. Further, the 3D displacement mapping maps a structural domain of the seismic volume (227) into a structurally restored domain of the restored seismic volume (228). In one or more embodiments, sampling positions in the seismic volume (227) are relocated based on the 3D displacement mapping to create the structurally restored domain where the restored seismic volume (228) can be displayed. Accordingly, other not yet interpreted seismic features (e.g., stratigraphic features) in the seismic volume (227) are mapped into restored seismic features (e.g., restored stratigraphic features) in the restored seismic volume (228). In one or more embodiments, the restored seismic volume (228) corresponds to partially reconstructed version of the seismic volume (227) if the structural restoration module (223) is configured to perform the aforementioned restoring while interpreting techniques.

In one or more embodiments, the dual domain analysis tool (220) is configured to perform chrono-stratigraphic interpretation based on the restored seismic volume (228) using the chrono-stratigraphic interpretation module (225). Specifically, the chrono-stratigraphic interpretation module (225) is configured to generate chrono-stratigraphic objects each associated with a respective relative geologic age. Further, the chrono-stratigraphic objects are sorted based on each respective relative geologic age for display in a chrono-stratigraphic space, referred to as a 3D Wheeler space. In one or more embodiments, the mapping generator (224) is further configured to generate a chrono-spatial mapping between the structurally restored domain and the chrono-stratigraphic space based on the chrono-stratigraphic interpretation. Examples of the structural domain, structurally restored domain, the chrono-stratigraphic space, the geological layer, the restored geological layer, and the stratigraphic feature, the restored stratigraphic features, etc. described above are shown in FIGS. 4.1-4.6 below.

In one or more embodiments, the dual domain analysis tool (220) is configured to provide one or more displays (e.g., 2D display, 3D display, etc.) using the data rendering module (226) for visualizing the data by the user during the chrono-stratigraphic interpretation. For example, the data may include the seismic volume (227), the restored seismic volume (228), the geological layer, the restored geological layer, the stratigraphic feature, the restored stratigraphic features, etc. described above, and/or combinations thereof during the aforementioned restoring while interpreting process and/or the chrono-stratigraphic interpretation. Specifically, the data rendering module (226) performs rendering algorithm calculations to provide the one or more displays that may be presented, using one or more communication links, to a user at the display unit (243) of the user system (240). The data rendering module (226) may provide, either by default or as selected by a user, displays composed of any combination of one or more of the structural domain, the structurally restored domain, and the chrono-stratigraphic space. In one or more embodiments, the data rendering module (226) is provided with mechanisms for actuating various display functions in the dual domain analysis tool (220).

The dual domain analysis tool (220) may include one or more system computers, which may be implemented as a server or any conventional computing system. However, those skilled in the art will appreciate that implementations of various technologies described herein may be practiced in other computer system configurations, including hypertext transfer protocol (HTTP) servers, hand-held devices, multi-processor systems, microprocessor-based or programmable consumer electronics, network personal computers, mini-computers, mainframe computers, and the like.

While specific components are depicted and/or described for use in the units and/or modules of the dual domain analysis tool (220), it will be appreciated that a variety of components with various functions may be used to provide the formatting, processing, utility and coordination functions necessary to modify a magnified field model in the dual domain analysis tool (220). The components may have combined functionalities and may be implemented as software, hardware, firmware, or combinations thereof.

Figure 3:
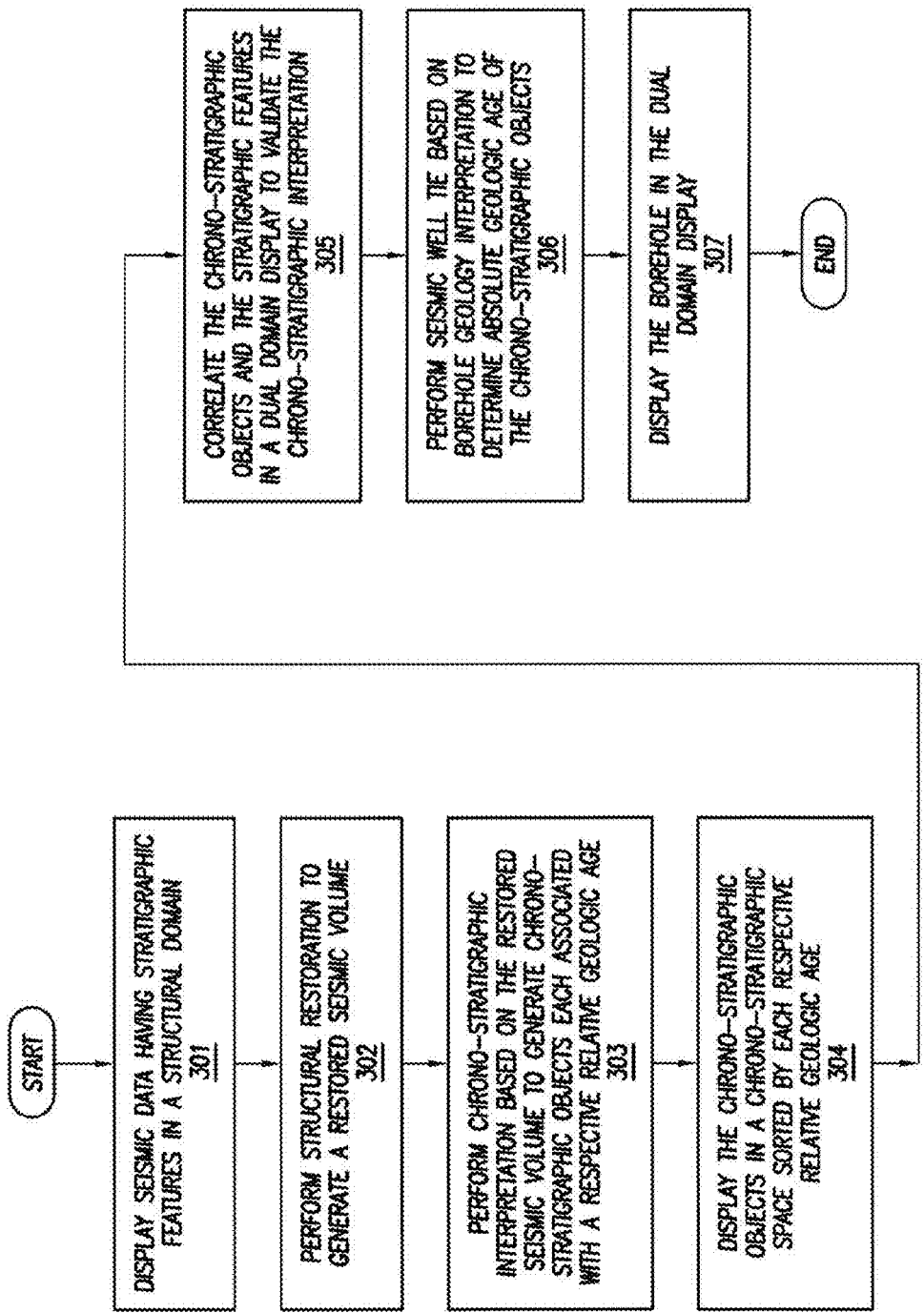
FIG. 3 shows an example method for chrono-stratigraphic and tectono-statigraphic interpretation on seismic volumes in accordance with one or more embodiments.

FIG. 3 shows an example method for chrono-stratigraphic and tectono-statigraphic interpretation on seismic volumes in accordance with one or more embodiments. For example, the method shown in FIG. 3 may be practiced using the system (200) described in reference to FIG. 2 above for the field (100) described in reference to FIG. 1 above. In one or more embodiments of the invention, one or more of the elements shown in FIG. 3 may be omitted, repeated, and/or performed in a different order. Accordingly, embodiments of chrono-stratigraphic and tectono-statigraphic interpretation on seismic volumes should not be considered limited to the specific arrangements of elements shown in FIG. 3.

Initially in Element 301, seismic data is displayed in a structural domain. Generally, the seismic data (e.g., seismic amplitude and two-way response time) represents an interaction of seismic wave propagation with geological layers in the subterranean formation. Deformations (e.g., faulting, folding, etc.) of geological layers caused by structural events may create features or patterns in the seismic data referred to as seismic events. Seismic data corresponding to a region of interest in the formation is referred to as a seismic volume. The structural domain may represent the region of interest in a time scale or a depth scale, where each scale is convertible to the other based on a velocity model of seismic wave propagation. In one or more embodiments, the seismic data may be sampled or interpolated for display according to a grid of the structural domain. In one or more embodiments, a seismic interpretation is performed for deciphering features in the displayed seismic data to identify a portion of the seismic data as relating to a geological layer. Accordingly, the portion of the seismic data is designated as an interpreted layer. In one or more embodiments, the interpreted layer may be included in a structural model of the formation, which in turn is restored by structural restoration. In one or more embodiments, the interpreted layer is associated with a particular tectonic phase of the formation. Additional details of interpreting seismic data to identify the interpreted layer for performing chrono-stratigraphic interpretation are described in reference to FIGS. 4.1-4.6 below.

In Element 302, a structural restoration is performed to remove effects of the deformations on the interpreted layer. In one or more embodiments, a geological layer may be restored using techniques known to those skilled in the art. In one or more embodiments, a geological layer may be restored using structural restoration technique of (1) determining a layer mapping based on an effect of the deformations on the geological layer, (2) generating a restored layer by applying the layer mapping to the geological layer for removing the effect of the deformations on the geological layer, (3) determining a de-compaction mapping based on a compaction effect of the geological layer on a remaining portion of the seismic data corresponding to other geological layers beneath the geological layer, and (4) generating de-compacted seismic data by applying the de-compaction mapping to the remaining portion of the seismic data for removing the compaction effect caused by the geological layer.

In one or more embodiments, the structural restoration is performed throughout the seismic volume to create a restored seismic volume containing seismic data (e.g., amplitudes) at sampling positions relocated to remove the deformations. In one or more embodiments, the structural restoration is performed for each layer concurrently with interpretation of remaining layers to create a partially restored seismic volume. In one or more embodiments, the structural restoration generates a 3D displacement mapping that maps between the seismic volume and the restored or partially restored seismic volume. Additional details of the restored seismic volume and partially restored seismic volume are described in reference to FIGS. 4.1-4.4 below.

In Element 303, chrono-stratigraphic interpretation is performed based on the restored seismic volume to generate chrono-stratigraphic objects each associated with a respective relative geologic age. With the faulting and/or folding effects removed from the seismic volume, interpretation confidence is improved in identifying the chrono-stratigraphic objects in the restored seismic volume. Example chrono-stratigraphic objects (referred to as horizon patches) are described in reference to FIGS. 4.4-4.6 below. In one or more embodiments, techniques for chrono-stratigraphic interpretation in structural domain of seismic volume may be extended and applied to perform chrono-stratigraphic interpretation in structurally restored domain of a restored seismic volume. Generally, respective relative geologic age determined using chrono-stratigraphic interpretation techniques known to those skilled in the art differentiates a younger chrono-stratigraphic object from an older chrono-stratigraphic object, and vice versa, without meaningful precision of actual age difference thereof.

In Element 304, the chrono-stratigraphic objects are displayed in a chrono-stratigraphic space sorted by each respective relative geologic age. Specifically, an x-axis and y-axis of the chrono-stratigraphic space represent lateral extents of the chrono-stratigraphic objects while a z-axis of the chrono-stratigraphic space represents respective relative geologic ages of the chrono-stratigraphic objects. Generally, the seismic volume is displayed in a structural domain. In one or more embodiments, the chrono-stratigraphic space and the structural domain are displayed simultaneously in a dual domain configuration. Accordingly in Element 305, the chrono-stratigraphic objects displayed in the chrono-stratigraphic space and the stratigraphic features displayed in the structural domain are correlated for validating the chrono-stratigraphic interpretation. For example, a chrono-stratigraphic object in the chrono-stratigraphic space may be identified as corresponding to a stratigraphic feature in the structural domain based on input of a user viewing the dual domain display. In one or more embodiments, the restored chrono-stratigraphic features of the restored seismic volume are displayed in the structurally restored volume and included in the dual domain configuration to facilitate the correlation. For example, a chrono-stratigraphic object can be correlated to a restored stratigraphic feature based on the chrono-stratigraphic interpretation while the restored stratigraphic feature can be further correlated to a stratigraphic feature based on the aforementioned 3D displacement mapping generated during the structural restoration.

In one or more embodiments, the structural restoration preserves a rock volume between the seismic volume and the restored seismic volume. With more clarity in visualizing the restored seismic volume and discerning surface boundaries in the structurally restored domain, thickness and/or lateral extents of restored stratigraphic features may be determined with higher confidence. In one or more embodiments, the lateral extent of a restored stratigraphic feature determined based on the structurally restored domain represents the lateral extent of a corresponding stratigraphic feature in the seismic volume and is used to define the lateral extent of a corresponding chrono-stratigraphic object in the chrono-stratigraphic space.

In one or more embodiments, thickness of a restored stratigraphic feature determined based on the structurally restored domain represents thickness of a corresponding stratigraphic feature in the seismic volume and is used to define the relative geologic age of a corresponding chrono-stratigraphic object in the chrono-stratigraphic space. Specifically, a deposition rate of a stratigraphic feature is obtained. For example, the deposition rate may be user defined, such as based on material types associated with the stratigraphic feature. In another example, rock materials in the geological layer containing the stratigraphic feature may be used to estimate the deposition rate. In one or more embodiments, a difference in geologic ages of two adjacent stratigraphic features is estimated based on the thickness (i.e., separation) therebetween and the corresponding estimated deposition rate. For example the age difference may be determined by dividing the thickness by the estimated deposition rate. Accordingly, the relative geologic ages of stratigraphic features and corresponding chrono-stratigraphical objects are determined cumulatively, for example by accumulating such age differences over the sorted sequence of the chrono-stratigraphical objects. In this manner, the depths associated with stratigraphic features are convertible, vice versa, to relative geologic ages of corresponding chrono-stratigraphical objects, thus creating a chrono-spatial mapping. In one or more embodiments, the depth scale of the seismic volume is convertible, and vice versa, to a relative geologic age scale in the chrono-stratigraphical space based on this chrono-spatial mapping. Accordingly, the relative geologic age determined as described above is associated with meaningful precision. Example dual domain display configurations and Additional details of determining chrono-spatial mapping are described in reference to FIGS. 4.3-4.6 below.

In Element 306, a seismic well tie is performed based on a borehole geology interpretation to determine absolute geologic age of the chrono-stratigraphic objects. Specifically, a borehole is identified that penetrates a portion (i.e., region of interest) of the subterranean formation corresponding to the seismic volume. In addition, a borehole geology interpretation of the borehole is obtained, which includes an interpreted borehole feature such as identifiable mineral or fossil trace. In one or more embodiments, an absolute geologic age of the interpreted borehole feature is determined based on a corresponding core sample. For example, the absolute geologic age of the mineral or fossil trace may be determined by core sample analysis techniques known to those skilled in the art. In one or more embodiments, a stratigraphic feature in the seismic volume is identified as corresponding to the interpreted borehole feature by comparing the borehole geology interpretation and the seismic volume interpretation. As described above, a chrono-stratigraphic object in the chrono-stratigraphic space may be identified as corresponding to the stratigraphic feature based on the chrono-spatial mapping. Accordingly, an absolute geologic age of the chrono-stratigraphic object is determined based on the absolute geologic age of the interpreted borehole feature. Additional details of the seismic well tie are described in reference to FIGS. 4.4, 5.1, and 5.2 below.

In one or more embodiments, the restored seismic volume corresponds to a portion of the seismic volume associated with a tectonic phase while the structural events deforming the portion of the seismic volume are tectonic events within the tectonic phase. In such embodiments, the respective relative geologic age of each of the chrono-stratigraphic objects is based on a relative geologic age scale of the tectonic phase that can be converted to a portion of an absolute geologic age scale based on the absolute geologic age of the interpreted borehole feature.

In Element 307, the borehole is displayed in the aforementioned dual domain display. In one or more embodiments, the interpreted borehole feature is displayed in the structural domain based on comparing the borehole geology interpretation and the seismic volume. In one or more embodiments, the interpreted borehole feature is displayed in the structurally restored domain based on at least the aforementioned 3D displacement mapping. In one or more embodiments, the interpreted borehole feature is displayed in the chrono-stratigraphic space based on at least the aforementioned 3D displacement mapping and the aforementioned chrono-spatial mapping. Example screenshots of displaying the borehole in the dual domain display are shown in FIGS. 4.4 and 5.2 below.

FIG. 4.1 depicts a screenshot (410) of an example structural domain described in reference to FIGS. 2 and 3 above. As shown, a three-dimensional (3D) structural model of a field (e.g., field (100) depicted in FIG. 1 above) is shown in the structural domain including a number of geological layers (e.g., corresponding to one or more of the sandstone layer (106-1), limestone layer (106-2), shale layer (106-3), and sand layer (106-4) depicted in FIG. 1 above). In one or more embodiments, the 3D structural model of the field is a paleospastic model, which depicts a geological object at the time of deposition. For example, the structural model has already been validated using the system and method described in reference to FIGS. 2 and 3 above. In particular, the structural model may have been created and validated using field data collected from any number of sources described in reference to FIG. 1 above, as well as using the system and method described in reference to FIGS. 2 and 3 above and, optionally in combination with any of a number of software programs or other subterranean formation model technologies known in the art. The structural model in FIG. 4.1 shows three geological layers (i.e., geological layer A (424), geological layer B (426), geological layer C (428)) of the field under the surface (430). Geological layer A (424), geological layer B (426), and geological layer C (428) may be consecutive geological layers in the subterranean formation. In addition, other geological layers, not shown in FIG. 4.1, may exist between geological layer A (424), geological layer B (426), and/or geological layer C (428). Further, although each of the geological layer A (424), geological layer B (426), and geological layer C (428) are shown schematically without substantial thickness in the particular scale of FIG. 4.1, each layer can be shown with real thickness in other scales (e.g., depicted as the sandstone layer (106-1), limestone layer (106-2), shale layer (106-3), or sand layer (106-4) in FIG. 1 above) with additional features (e.g., sedimentary layers) contained therein.

As can be seen, geological layer A (424), geological layer B (426), and geological layer C (428) contain undulations designating relative elevation within each part of the geological layers. Generally, such undulations represent faulting and/or folding effects of geological events, which may be combined with compaction effect due to gravity. In one or more embodiments, the extent of various undulations in geological layers are depicted by color coding, hatching, or some other way of designating relative elevation within each part of geological layers. In this example in FIG. 4.1, the undulations within geological layer A (424), geological layer B (426), and geological layer C (428) are shown by hatching.

Geological layer A (424) is the oldest shown geological layer in the field because geological layer A (424) is the furthest geological layer from the surface (430). Geological layer B (426) is the second oldest shown geological layer in the field because geological layer B (426) is the second furthest geological layer from the surface (430). Geological layer C (428) is the youngest shown geological layer in the field because geological layer C (428) is the closest geological layer to the surface (430). When restoring the geological layers from the structural model, the newest geological layer (i.e., geological layer C (428)) may be restored initially, followed by the next youngest geological layer (i.e., geological layer B (426)) and so on.

FIG. 4.2 depicts a screenshot (420) of an example structurally restored domain described in reference to FIGS. 2 and 3 above. As shown, geological layer A (440), which is a reconstruction (i.e., structurally restored version) of geological layer A (424) in FIG. 4.1 and the oldest geological layer in the subterranean formation is shown in the structurally restored domain. As noted above, although the geological layer A (440) is shown schematically without substantial thickness in the particular scale of FIG. 4.2, the layer can be shown with real thickness in other scales (e.g., depicted as the sandstone layer (106-1), limestone layer (106-2), shale layer (106-3), or sand layer (106-4) in FIG. 1 above) with additional features (e.g., sedimentary layers) contained therein.

As can be seen, geological layer A (440) contains significantly fewer undulations compared to geological layer A (424) in FIG. 4.1 because the faulting and folding effects of the geological events and compaction effects of the geological layer B (426) and geological layer C (428) are largely removed by the restoration process. In this example in FIG. 4.2, the undulations within geological layer A (440) are shown by hatching.

In one or more embodiments, as a geological layer of the subterranean formation in the field (e.g., geological layer A (424), geological layer B (426), or geological layer C (428) from FIG. 4.1) is restored, chrono-stratigraphic interpretation within the restored geological layer may be performed using a simultaneous viewing of the geological layer in the structural domain and structurally restored domain depicted in FIGS. 4.1 and 4.2, respectively. Example screenshots depicting the chrono-stratigraphic interpretation based on dual-domain display are shown in FIGS. 4.3-4.6 below.

In one or more embodiments, the chrono-stratigraphic interpretation is performed after all geological layers in the seismic volume are restored. In such embodiments, any structural restoration technique known to those skilled in the art may be used.

In one or more embodiments, the chrono-stratigraphic interpretation is performed in a restored geological layer before other geological layers in the seismic volume are restored. In one or more embodiments, the youngest geological layer is the first to be restored and interpreted, followed by the next youngest, and so on. FIG. 4.3 shows an example screenshot illustrating a restoring while interpreting technique. Additional details of such restoring while interpreting techniques are described in the aforementioned copending U.S. patent application Ser. No. 12/845,958, which is incorporated herein by reference.

FIG. 4.3 depicts a screenshot (430) of an example structural domain and a screenshot (431) of an example structurally restored domain illustrating a restoring while interpreting technique. In the screenshots (430) and (431), 3D data volumes collected in a field (e.g., field (100) depicted in FIG. 1 above) are rotated to show cross-sectional views of seismic amplitudes with highlighted features. In one or more embodiments, the seismic amplitudes are depicted by color coding, hatching, or some other way of designating seismic amplitudes. In this example in FIG. 4.3, the seismic amplitudes within the screenshots (430) and (431) are shown by hatching. For clarity, solid lines are used to highlight seismic features that are already interpreted and/or validated while dash lines are used to highlight seismic features not yet interpreted and/or validated.

As shown in the screenshot (430), solid line segments (401-1, 401-2, 401-3) and solid line segments (402-1, 402-2, 402-3) represent interpreted and/or validated seismic features. Depending on the relative scales, the solid line segments may correspond to geological layer C (428) and geological layer B (426), respectively, or correspond to a top surface and bottom surface of geological layer B (426) as depicted in FIG. 4.1 above. In addition, dash line segments (403-1, 403-2, 403-3), dash line segments (404-1, 404-2, 404-3), and dash line segments (407-1, 407-2, 407-3) represent seismic features not yet interpreted and/or validated, from which geological layer A (424) and other structure and stratigraphy are being interpreted and/or validated during the interactive structural restoration while interpreting seismic volumes. Further as shown in screenshot (430), line segment (405) and line segment (406) each include solid and dashed portions representing faults created by geological events where solid portions have been interpreted and/or validated and dash portions have not yet been interpreted and/or validated.

As shown in the screenshot (431), solid line segments (411-1, 411-2, 411-3) and solid line segments (412-1, 412-2, 412-3), which are reconstructions (i.e., structurally restored version) of solid line segments (401-1, 401-2, 401-3) and solid line segments (402-1, 402-2, 402-3), respectively, corresponding to at least one of the two youngest geological layers B (426) and C (428) in the subterranean formation, are shown in the structurally restored domain. As can be seen, solid line segments (411-1, 411-2, 411-3) and solid line segments (412-1, 412-2, 412-3) contain significantly fewer undulations as compared to solid line segments (401-1, 401-2, 401-3) and solid line segments (402-1, 402-2, 402-3) in screenshot (430) because the faulting and folding effects of the geological events and gravity induced compaction effects are largely removed by the restoration process.

Further as shown in screenshot (431), dash line segments (413-1, 413-2, 413-3), dash line segments (414-1, 414-2, 414-3), and dash line segments (417-1, 417-2, 407-3) are de-compacted version of dash line segments (403-1, 403-2, 403-3), dash line segments (404-1, 404-2, 404-3), and dash line segments (407-1, 407-2, 407-3). Specifically, gravity induced compaction effects from at least one of the geological layer C (428) and geological layer B (426) are removed in the de-compacted version during the structural restorations thereof. Although the faulting and folding effects of the geological events on dash line segments (413-1, 413-2, 413-3), dash line segments (414-1, 414-2, 414-3), and dash line segments (417-1, 417-2, 407-3) are not yet removed prior to the structural restoration of geological layer A (424) and other structure and stratigraphy, these dash line segments contain relatively less undulations compared to the corresponding dash line segments in screenshot (430), and, thus, provide improved interpretation confidence. In one or more embodiments, the screenshots (430) and (431) are viewed simultaneously during interactive structural restoration while interpreting seismic structure and stratigraphy. In one or more embodiments, all or a portion of the screenshots (410), (420), (430), and (431) are viewed interchangeably and simultaneously during interactive structural restoration while interpreting seismic structure and stratigraphy. In one or more embodiments, the screenshot (410 of FIG. 4.1) is superimposed with the screenshot (430) in the structural domain, and/or the screenshot (420 of FIG. 4.2) is superimposed with the screenshot (431) in the structurally restored domain, where the two domains are viewed simultaneously during interactive structural restoration while interpreting seismic structure and stratigraphy.

In one or more embodiments, each of the geological layer A (424), geological layer B (426), and geological layer C (428) of FIG. 4.1 corresponds to a particular tectonic phase. As noted above, based on the relative scales, the aforementioned solid line segments may correspond to a top surface and bottom surface of geological layer B (426) of FIG. 4.1 associated with a tectonic phase. In such depiction of FIG. 4.3, chrono-stratigraphic interpretation may be performed within the portion of seismic volume in the screenshot (431) corresponding to the restored geological layer B (426) and geological layer C (428) of FIG. 4.1. Concurrently, restoring while interpreting techniques may be performed within the portion of seismic volume in the screenshot (431) corresponding to the not yet restored geological layer A (424) of FIG. 4.1. In such embodiments, the solid line segments and dashed line segments represent coarse features in the seismic volume induced by tectonic folding and/or faulting events. Once the effects of such tectonic folding and/or faulting events are removed by the structural restoration process, less visible finer features in the seismic volume induced by sedimentary depositions may be identified and dated by the chrono-stratigraphic interpretation with a higher interpretation confidence. For example, sedimentary layers may not be deciphered easily in the structural domain prior to the restoration. In one or more embodiments, such chrono-stratigraphic interpretation is performed one tectonic phase a time.

As the restoring while interpreting process progresses, the dashed line segments in the screenshot (430) may be converted into solid line segments. Accordingly, at the end of the restoring while interpreting process, the entire screenshot (430) may include all solid line segments representing a fully interpreted seismic volume corresponding to the present day subterranean formation. Correspondingly, the dashed line segments in the screenshot (431) may be converted into solid line segments upon being restored in the restoring while interpreting process. In this case, at the end of the restoring while interpreting process, the entire screenshot (431) includes all solid line segments representing a fully interpreted and restored seismic volume corresponding to the present day subterranean formation.

FIG. 4.4 depicts a screenshot (440-1) having a window (435) showing an example structural domain and a window (432) showing an example structurally restored domain. In addition, FIG. 4.4 depicts a screenshot (440-2) having a window (433) essentially the same as the window (432), a window (434) showing an expanded view of a portion of the window (433), and a window (437) showing example horizon patches, as described with Additional details in reference to FIGS. 4.5 and 4.6 below. In the screenshots (440-1) and (440-2), 3D data volumes collected in a field (e.g., field (100) depicted in FIG. 1 above) are rotated to show cross-sectional views of seismic amplitudes with highlighted features. In one or more embodiments, the seismic amplitudes are depicted by color coding, hatching, or some other way of designating seismic amplitudes. In the example of FIG. 4.4, the seismic amplitudes within the screenshots (440-1) and (440-2) are shown by hatching. In one or more embodiments, the seismic volume represented in the windows (432) and (433) are reconstruction of the seismic volume represented in the window (435) and is generated by structural restoration process described in reference to FIGS. 3-4.3 above. For example, the windows (435) and (432) may represent the end results of the screenshots (430) and (431) of FIG. 4.4, respectively, at the end of the restoring while interpreting process.

As shown in FIG. 4.4, the window (435) includes a portion (436-1) of the seismic image corresponding to a geological layer (e.g., the geological layer A (424) depicted in FIG. 4.1 above) exhibiting faulting and folding effects of tectonic events. In one or more embodiments, such tectonic events characterize the tectonic phase associated with the geological layer. In addition, the window (432) includes a portion (436-2) reconstructed from the portion (436-1) by the aforementioned structural restoration process. As shown in the screenshots (440-1), the original seismic depth volume is restored to remove one or more structural episodes visible in the seismic volume. For example, the structural restoration process removes the faulting and folding effects of tectonic events exhibited in the seismic image portion (436-1) in the window (435) such that the resultant seismic image portion (436-2) in the window (432) contains relatively less undulations in comparison. In one or more embodiments, the portions (436-1) and (436-2) may correspond to the portions (453-1) and (453-2) depicted in the screenshots (430) and (431), respectively.

In one or more embodiments, the aforementioned structural restoration process is performed consistently with the interpretation of structural zones and structural dip removal on the borehole geology interpretation for wells within the study area. Additional details of well control based on borehole geology interpretation are described in reference to FIG. 4.5 below. In one or more embodiments, the structural restoration process is performed without well control if such information is unavailable.

Accordingly, chrono-stratigraphic interpretation may be performed for the tectonic phase in this example structurally restored domain (also referred to as structure-free domain) depicted in the window (432) with improved interpretation confidence. Specifically, chrono-stratigraphic analysis and additional detail of the stratigraphic geometry will be easier to decipher from the structurally restored volume compared to the original seismic volume. In particular, additional tools for the stratigraphic interpretation, such as chrono-stratigraphic sorting of events and 3D Wheeler views may be more effectively used due to the correct spatial distribution of sequence boundary surfaces identified in the portion (436-2) of the structurally restored volume.

In one or more embodiments, the windows (435) and (432) are viewed simultaneously during chrono-stratigraphic interpretation of the geological layer corresponding to the seismic image portions (436-1) and (436-2). Such dual-domain interpretation methods allow the user to view the chrono-stratigraphic interpretation concurrently in the structurally restored and original structural views.

Further as shown in FIG. 4.4, the screenshot (440-2) includes the window (433) containing essentially the same view of the seismic volume displayed in the window (432). A portion (436-3) of the window (433) corresponds to the portion (436-2) of the window (432) is displayed in an expanded view in the window (434) showing a higher level of detail of the geological layer created during the aforementioned tectonic phase. In one or more embodiments as described in reference to FIG. 3 above, surface primitives may be extracted from the seismic volume and assigned respective relative geologic ages in the structurally restored domain shown in the window (433). As noted above, the extracted surface primitives are surface segments spatially continuous along the extrema of the seismic volume. Such surface segments are referred to as horizon patches and are displayed as a chrono-stratigraphic view in the window (435) in the screenshot (440-2). The chrono-stratigraphic view is referred to as a 3D Wheeler space.

The identification and association of key structural surfaces and sequence boundaries in relation to the chrono-stratigraphic view (435), the structurally restored version (432), (433), and (434), or the original structural view (435) allow geologic age indexing of the structural activities isolated as an elementary tectonic phase (e.g., the tectonic phase associated with the geological layer depicted in the window (434)). By repeating the process described above for each of a number of tectonic phases, structural restoration and chrono-stratigraphic interpretation results of various tectonic phases can then be linked to the stress computation (from geomechanical modeling) and the results tabulated to present the tectono-stratigraphic history of the volume of interest (e.g., the entire volume shown in the window (435)). Periods of erosion and hiatus may also be identified as part of tecto-stratigraphic history. Typically, these erosion and hiatus periods become apparent during the structural restoration of the volume.

FIG. 4.5 depicts a screenshot (460) having a window (462) showing seismic volume in an example structural domain, a window (461) showing an example chrono-stratigraphic view of horizon patches in an example structure-free domain, and a geologic age indexing window (463), as described in reference to FIG. 4.4 above. Throughout this document, the terms "domain" and "view window" may be used interchangeable depending on the context. In the windows (462) and (463), 3D data volumes collected in a field (e.g., field (100) depicted in FIG. 1 above) are rotated to show perspective views of seismic amplitudes with highlighted features. In one or more embodiments, the seismic amplitudes are depicted by color coding, hatching, or some other way of designating seismic amplitudes. In this example in FIG. 4.5, the seismic amplitudes within the windows (462) are shown by hatching. In one or more embodiments, the horizon patches shown in the window (461) are generated using the method described in reference to FIG. 3 above. In one or more embodiments, the horizon patches shown in the windows (462) and (463) correspond to an isolated tectonic phase. Additional details of determining lateral extent of each horizon patch and separations between the horizon patches are described in reference to FIG. 4.6 below.

As shown in FIG. 4.5, horizon patches can be identified and correlated between the structural domain in the window (461), the chrono-stratigraphic view in the window (462), and the geologic age indexing window (463). For example, horizon patches (464-1), (464-2), and (464-3) in the window (461) correspond to horizon patches (474-1), (474-2), and (474-3), respectively in the window (462) and correspond to horizon line segments (424-1), (424-2), and (424-3), respectively in the window (463). As shown, the geologic age indexing window (463) includes a 2D cross-sectional view (466) of the chrono-stratigraphic space shown in the window (461). Accordingly, the horizon line segments (424-1), (424-2), and (424-3) represents intersections of the horizon patches (464-1), (464-2), and (464-3) with a viewing plane (469) in the window (461). In one or more embodiments, the viewing plane (469) is user rotatable around a z-axis in the window (461). Typically, the z-axis is substantially perpendicular to the horizon patches (464-1), (464-2), and (464-3) in the window (461). Further as shown in FIG. 4.5, the geologic age indexing window (463) includes well log (465) and eustatic curve (468) (i.e., representation of the changes of the sea level throughout the geological history) used as geologic age markers to calibrate the assigned relative geologic age scale into absolute geologic age scale. In addition, various attributes (e.g., boundaries, base level, rate of change, age, etc.) of the horizon patches are shown as tracks (467) in the geologic age indexing window (463).

FIG. 4.6 depicts 3D screenshot windows (481) and (482) corresponding to the windows (462) and (461) shown in FIG. 4.5, respectively. As shown in FIG. 4.6, a cross-sectional view (484) of the window (482) includes curved line segments (e.g., curved line segments (491-1), (492-1), and (493-1)) corresponding to horizon patches in the window (482). Similar to the cross-sectional view described in reference to the window (435) depicted in FIG. 4.4 above, the cross-sectional view (484) has a horizontal axis representing distance and a vertical axis representing depth. Further, a cross-sectional view (483) of the window (481) includes line segments (e.g., line segments (491-2), (492-2), and (493-2)) corresponding to horizon patches in the window (481). Similar to the cross-sectional view (466) depicted in FIG. 4.5 above, the cross-sectional view (483) has a horizontal axis representing structurally restored distance and a vertical axis representing relative geologic age.

As noted above, the horizon patches depicted in the windows (481) and (482) are correlated. For example, the curved line segments (491-1), (492-1), and (493-1) correspond to the line segments (491-2), (492-2), and (493-2), respectively. As shown in the cross-sectional views (484) and (483), the curved line segments (491-1), (492-1), and (493-1) are restored into the line segments (491-2), (492-2), and (493-2) by the structural restoration process where corresponding curved line segments and line segments have the same equivalent lengths and equivalent separations. For example, the end point (485-1) of the curved line segment (491-1) is shown to be extended and correspond to the end point (485-2) of the line segment (491-2) such that the curved line segment (491-1) and the line segment (491-2) have the same equivalent length. In addition, the separation (489) between the curved line segments (492-1) and (493-1) in the depth scale is converted to the separation (490) between the line segments (492-2) and (493-2) in the relative geologic age scale based on user assigned deposition rate. In one or more embodiments, the deposition rate is estimated based on characteristics of the geological layer associated with the particular tectonic phase as well as the specific sediment composition within the separation (489). Accordingly, the depth indexed separation (489) and the relative geologic age indexed separation (490) are equivalent to each other based on the estimated deposition rate. In one or more embodiments, in FIG. 4.5, the well log (465) and the eustatic curve (468) are integrated into the geologic age indexing view (463) based on this equivalence (i.e., deposition rate based mapping) between the depth indexed scale and relative geologic age indexed scale. Accordingly, specific marker events with known absolute geologic age within the well log (465) (e.g., based on identifiable mineral or fossil traces that can be dated with some certainty) and the eustatic curve (468) (i. e., based on global sea level changes) are used to calibrate the relative geologic age scale into the absolute geologic age scale. For example, relative geologic age is converted into the absolute geologic age by linking known bio-stratigraphic markers and/or sea level trends to the same features in relative the geologic age scale then stretching the relative geologic age scale to match the absolute geologic scale at the known marker positions.

FIGS. 5.1 and 5.2 show an example workflow (510) with a series of screenshots (596)-(598) for chrono-stratigraphic and tectono-statigraphic interpretation on seismic volumes in accordance with one or more embodiments. In one or more embodiments, the workflow (510) and screenshots (596)-(598) are based on the system and method described in reference to FIGS. 2 and 3 above and is applicable to the field (100) depicted in FIG. 1 above.

As shown in FIG. 5.1, the workflow (510) begins with depth domain seismic data (511). In one or more embodiments, a relative geologic age indexing is performed on the seismic depth volume (511) directly to estimate geologic age in areas of little or no well data based on the chrono-stratigraphy and base-level trend interpretation. Specifically, the time domain seismic data (511) is analyzed, as illustrated by box (512), to extract seismic surfaces (513) such as horizon patches. The workflow (510) continues with the chrono-stratigraphic sorting of seismic events (e.g., representing the horizon patches), as illustrated by box (514), and the construction of a relative geologic age index (522). In one or more embodiments, chrono-stratigraphic sorting illustrated in box (514) is based on a 3D Wheeler space depicted in the screenshot (597) of FIG. 5.2 that allows for the construction of a local base-level curve. In addition, sedimentation rates are estimated from this interpretation to compute the thicknesses of decompacted sediment present in the seismic section, as illustrated by box (515). Specifically, within the box (515), the true stratigraphic thickness is calculated between the seismic events. The thickness (in depth) may be the shortest distance between the two seismic event surfaces along a vector defined by the average dips of the two events. This depth thickness is then mapped to a user-defined deposition rate to determine a relative geologic age used in the relative geologic age index (522).

In one or more embodiments, a seismic well-tie is performed to associate key geologic markers in the well log (e.g., borehole data (516)) to corresponding surfaces extracted from the seismic volume, as illustrated by box (524). Specifically, the borehole data (516) may be used to compute structural boundaries, as illustrated by box (518), for validating the extracted seismic surfaces (513), as illustrated by box (520). The screenshot (596) of FIG. 5.2 depicts a representation (596-1) of the borehole data (516) superimposed in the seismic volume corresponding to the seismic data (511) in a depth domain that can be reviewed when validating the extracted seismic surfaces (513). Further, the borehole data (516) may be used to compute stratigraphic thickness, as illustrated by box (519), for validating the stratigraphic thickness computed in the box (515), as illustrated by box (521). Once calibrated in this fashion, the borehole data (516) can be transformed from a depth indexed representation to a relative geologic age index presentation (598-1) depicted in the screenshot (598) of FIG. 5.2. In particular, the depth indexed representation (596-1) of the borehole data (516) superimposed in the seismic volume is converted to the geologic age indexed representation (598-1) superimposed in the 3D Wheeler space depicted in the screenshot (598). A cross-sectional view of the screenshot (598) corresponds to the well log (465) and cross-sectional view (466) shown in geologic age indexing window (463) of FIG. 4.5 above. As shown in FIG. 5.2, the screenshots (596) and (597) are schematically linked by the seismic well tie (524) in the workflow (510) to generate the screenshot (598), as illustrated by box (523) in the workflow (510).

In one or more embodiments, the workflow (510) is performed for a portion of the seismic volume (511) identified as being within a tectonic phase. In the case where the seismic volume (511) corresponds to multiple tectonic phases, the workflow (510) may be performed for each of the tectonic phases for an expanded scope of tectono-stratigraphic interpretation. In one or more embodiments, an example workflow for tectono-stratigraphy includes elements of (1) assigning absolute age to structural restoration surfaces/planes using global eustatic curve and/or well data, as illustrated by box (517) of FIG. 5.1; (2) assigning the interval between successive structural restoration surfaces/planes as elementary tectonic phase with absolute age limits; (3) linking a type of the restoration activity (e.g. normal fault restoration) that has been carried out in each tectonic phase; (4) linking relative stress direction and magnitudes for each of the deformation with corresponding tectonic phases; and (5) optionally plotting results from elements (2)-(4) in a tabular format for interpretation and modeling purposes (e.g., sedimentation studies or petroleum systems modeling).

Figure 6:
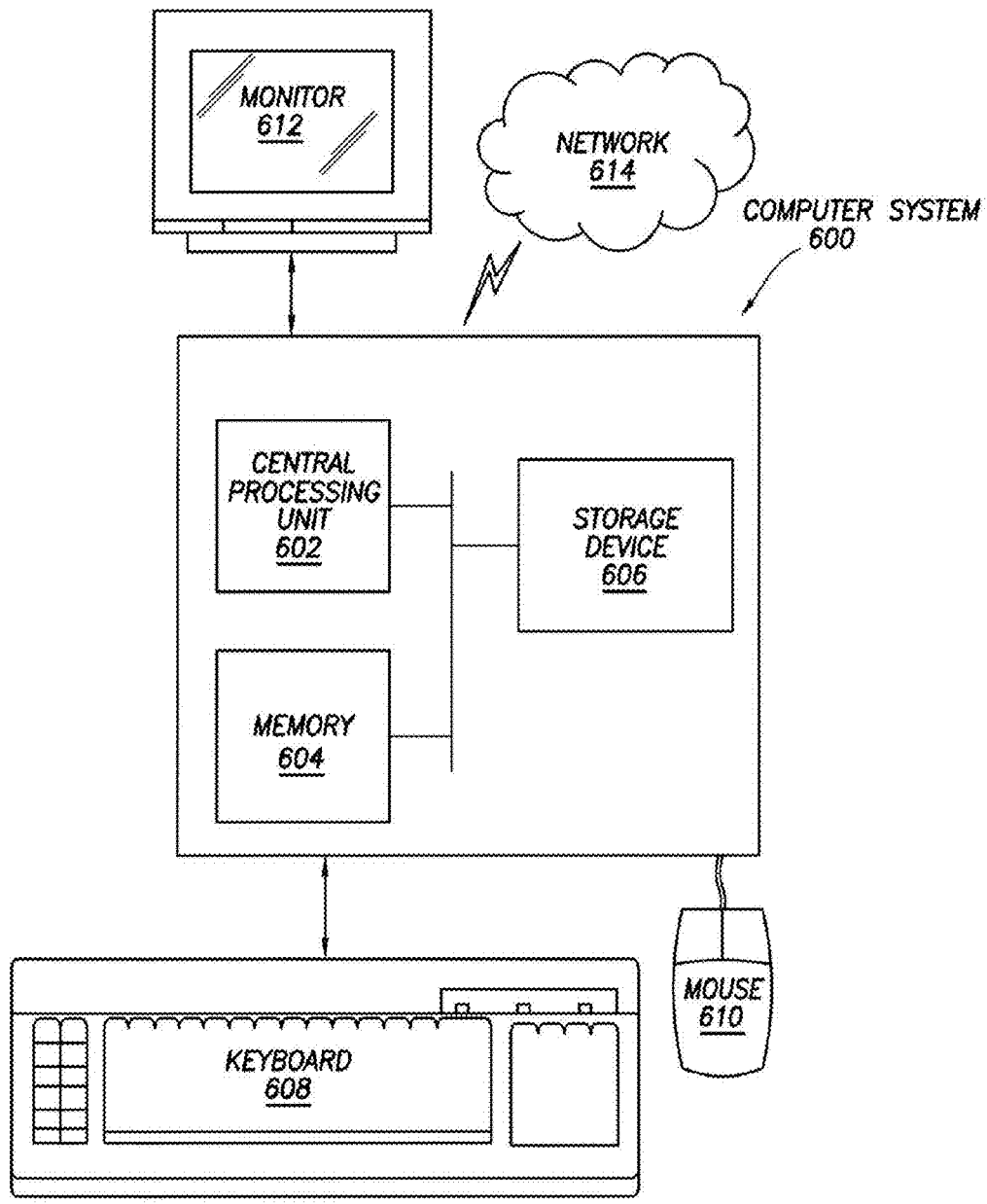
FIG. 6 shows a computer system in which one or more embodiments of chrono-stratigraphic and tectono-statigraphic interpretation on seismic volumes may be implemented.

Embodiments of chrono-stratigraphic and tectono-statigraphic interpretation on seismic volumes may be implemented on virtually any type of computer regardless of the platform being used. For instance, as shown in FIG. 6, a computer system (600) includes one or more processor(s) (602) such as a central processing unit (CPU) or other hardware processor, associated memory (604) (e.g., random access memory (RAM), cache memory, flash memory, etc.), a storage device (606) (e.g., a hard disk, an optical drive such as a compact disk drive or digital video disk (DVD) drive, a flash memory stick, etc.), and numerous other elements and functionalities typical of today's computers (not shown). The computer (600) may also include input means, such as a keyboard (608), a mouse (610), or a microphone (not shown). Further, the computer (600) may include output means, such as a monitor (612) (e.g., a liquid crystal display LCD, a plasma display, or cathode ray tube (CRT) monitor). The computer system (600) may be connected to a network (614) (e.g., a local area network (LAN), a wide area network (WAN) such as the Internet, or any other similar type of network) via a network interface connection (not shown). Those skilled in the art will appreciate that many different types of computer systems exist (e.g., desktop computer, a laptop computer, or any other computing system capable of executing computer readable instructions), and the aforementioned input and output means may take other forms, now known or later developed. Generally, the computer system (600) includes at least the minimal processing, input, and/or output means necessary to practice one or more embodiments.

Further, those skilled in the art will appreciate that one or more elements of the aforementioned computer system (600) may be located at a remote location and connected to the other elements over a network. Further, one or more embodiments may be implemented on a distributed system having a plurality of nodes, where each portion of the implementation (e.g., various components of the dual domain analysis tool) may be located on a different node within the distributed system. In one or more embodiments, the node corresponds to a computer system. Alternatively, the node may correspond to a processor with associated physical memory. The node may alternatively correspond to a processor with shared memory and/or resources. Further, software instructions to perform one or more embodiments may be stored on a computer readable storage medium such as a compact disc (CD), a diskette, a tape, or any other computer readable storage device.

The systems and methods provided relate to the acquisition of hydrocarbons from an oilfield. It will be appreciated that the same systems and methods may be used for performing subsurface operations, such as mining, water retrieval and acquisition of other underground fluids or other geomaterials materials from other fields. Further, portions of the systems and methods may be implemented as software, hardware, firmware, or combinations thereof.

While the invention has been described with respect to a limited number of embodiments, those skilled in the art, having benefit of this disclosure, will appreciate that other embodiments may be devised which do not depart from the scope of the invention as disclosed herein. Accordingly, the scope of the invention should be limited only by the attached claims.

What is claimed is:

1. A method for performing chrono-stratigraphic interpretation of a subterranean formation, comprising:
   obtaining a seismic volume comprising a plurality of stratigraphic features of the subterranean formation, wherein the plurality of stratigraphic features are deformed by a plurality of structural events;
   performing, using a processor of a computer system, a structural restoration of the seismic volume to generate a restored seismic volume by removing deformation due to the plurality of structural events, wherein the restored seismic volume comprises a plurality of restored stratigraphic features;
   performing, using the processor, a chrono-stratigraphic interpretation based on the restored seismic volume to generate a plurality of chrono-stratigraphic objects each associated with a respective relative geologic age;
   displaying the plurality of chrono-stratigraphic objects in a chrono-stratigraphic space according to the respective relative geologic age of each of the plurality of stratigraphic objects;
   displaying the seismic volume in a structural domain;
   correlating the plurality of chrono-stratigraphic objects displayed in the chrono-stratigraphic space and the plurality of stratigraphic features displayed in the structural domain to obtain a correlation;
   validating the chrono-stratigraphic interpretation based on the correlation;
   identifying a thickness of a stratigraphic feature of the plurality of stratigraphic features based on the seismic volume;
   obtaining a deposition rate of the stratigraphic feature;
   identifying a chrono-stratigraphic object of the plurality of chrono-stratigraphic objects as corresponding to the stratigraphic feature based on the correlation; and
   determining the respective relative geologic age of the chrono-stratigraphic object based at least on the thickness and the deposition rate.

2. The method of claim 1, further comprising:
   identifying a first lateral extent of the stratigraphic feature; and
   determining a second lateral extent of the chrono-stratigraphic object based on the first lateral extent of the stratigraphic feature by removing faulting and folding effects of the deformation during the structural restoration.

3. The method of claim 1, further comprising:
   displaying the restored seismic volume in a structurally restored domain;
   determining a 3D displacement mapping between the structural domain and the structurally restored domain based on the structural restoration; and
   determining a chrono-spatial mapping between the structurally restored domain and the chrono-stratigraphic space based on the chrono-stratigraphic interpretation,
   wherein the correlation is generated at least based on the 3D displacement mapping and the chrono-spatial mapping.

4. A system for performing chrono-stratigraphic interpretation of a subterranean formation, comprising:
   a structural restoration module executing on a processor and configured to perform structural restoration of a seismic volume to generate a restored seismic volume by removing deformation due to a plurality of structural events, wherein the seismic volume comprises a plurality of stratigraphic features of the subterranean formation;
   a chrono-stratigraphic interpretation module executing on the processor and configured to:
      perform chrono-stratigraphic interpretation based on the restored seismic volume to generate a plurality of chrono-stratigraphic objects each associated with a respective relative geologic age,
      identify a thickness of a stratigraphic feature of the plurality of stratigraphic features based on the seismic volume,
      obtain a deposition rate of the stratigraphic feature,
      identify a chrono-stratigraphic object of the plurality of chrono-stratigraphic objects as corresponding to the stratigraphic feature based on the correlation, and
      determine the respective relative geologic age of the chrono-stratigraphic object based at least on the thickness and the deposition rate;
   a display device configured to:
      display the plurality of chrono-stratigraphic objects in a chrono-stratigraphic space according to the respective relative geologic age of each of the plurality of stratigraphic features, and
      display the seismic volume in a structural domain; and
   memory storing instructions when executed by the processor comprising functionality to:
      obtain the seismic volume,
      correlate the plurality of chrono-stratigraphic objects displayed in the chrono-stratigraphic space and the plurality of stratigraphic features displayed in the structural domain to obtain a correlation, and
      validate the chrono-stratigraphic interpretation based on the correlation.

5. The system of claim 4, the chrono-stratigraphic interpretation module further configured to:
   identify a first lateral extent of the stratigraphic feature; and
   determine a second lateral extent of the chrono-stratigraphic object based on the first lateral extent of the stratigraphic feature by removing faulting and folding effects of the deformation during the structural restoration.

6. The system of claim 4, the display device further configured to display the restored seismic volume in a structurally restored domain, and the system further comprising a mapping generator executing on the processor and configured to:
   determine a 3D displacement mapping between the structural domain and the structurally restored domain based on the structural restoration; and
   determine a chrono-spatial mapping between the structurally restored domain and the chrono-stratigraphic space based on the chrono-stratigraphic interpretation,
   wherein the correlation is generated at least based on the 3D displacement mapping and the chrono-spatial mapping.

7. A non-transitory computer readable storage medium storing instructions for performing chrono-stratigraphic interpretation of a subterranean formation, the instructions when executed causing a processor to:
   obtain a seismic volume comprising a plurality of stratigraphic features of the subterranean formation, wherein the plurality of stratigraphic features are deformed by a plurality of structural events;
   perform a structural restoration of the seismic volume to generate a restored seismic volume by removing deformation due to the plurality of structural events, wherein the restored seismic volume comprises a plurality of restored stratigraphic features;
   perform a chrono-stratigraphic interpretation based on the restored seismic volume to generate a plurality of chrono-stratigraphic objects each associated with a respective relative geologic age; and
   display the plurality of chrono-stratigraphic objects in a chrono-stratigraphic space according to the respective relative geologic age of each of the plurality of stratigraphic objects;
   display the seismic volume in a structural domain;
   correlate the plurality of chrono-stratigraphic objects displayed in the chrono-stratigraphic space and the plurality of stratigraphic features displayed in the structural domain to obtain a correlation;
   validate the chrono-stratigraphic interpretation based on the correlation;
   identify a thickness of a stratigraphic feature of the plurality of stratigraphic features based on the seismic volume;
   obtain a deposition rate of the stratigraphic feature;
   identify a chrono-stratigraphic object of the plurality of chrono-stratigraphic objects as corresponding to the stratigraphic feature based on the correlation; and
   determine the respective relative geologic age of the chrono-stratigraphic object based at least on the thickness and the deposition rate.

* * * * *